(12) United States Patent
Kim et al.

(10) Patent No.: US 12,243,891 B2
(45) Date of Patent: Mar. 4, 2025

(54) IMAGE SENSOR AND METHOD OF MANUFACTURING THE SAME

(71) Applicant: SAMSUNG ELECTRONICS CO., LTD., Suwon-si (KR)

(72) Inventors: Kook Tae Kim, Hwaseong-si (KR); Miseon Park, Hwaseong-si (KR); Soojin Hong, Guri-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 569 days.

(21) Appl. No.: 17/518,756

(22) Filed: Nov. 4, 2021

(65) Prior Publication Data

US 2022/0173143 A1   Jun. 2, 2022

(30) Foreign Application Priority Data

Nov. 30, 2020 (KR) ................. 10-2020-0164117

(51) Int. Cl.
*H01L 27/146* (2006.01)

(52) U.S. Cl.
CPC .... *H01L 27/1463* (2013.01); *H01L 27/14614* (2013.01); *H01L 27/14643* (2013.01); *H01L 27/14689* (2013.01)

(58) Field of Classification Search
CPC .................................................. H01L 27/1463
See application file for complete search history.

(56) References Cited

U.S. PATENT DOCUMENTS

| | | | |
|---|---|---|---|
| 8,664,578 B2 | 3/2014 | Hirigoyen et al. | |
| 8,964,081 B2 | 2/2015 | Ohkubo et al. | |
| 9,054,007 B2 | 6/2015 | Hu et al. | |
| 10,319,768 B2 | 6/2019 | Li et al. | |
| 10,432,883 B1 | 10/2019 | Chapman et al. | |
| 10,658,410 B2 | 5/2020 | Cheng et al. | |
| 10,672,825 B2 | 6/2020 | Takeda | |
| 10,700,114 B2 | 6/2020 | Honda et al. | |
| 10,727,265 B2 | 7/2020 | Wu et al. | |
| 2015/0243694 A1* | 8/2015 | Ihara | H01L 27/14621 257/443 |
| 2019/0378865 A1* | 12/2019 | Zhang | H01L 27/14605 |
| 2020/0219928 A1 | 7/2020 | Park et al. | |
| 2020/0235148 A1 | 7/2020 | Shim | |
| 2023/0343883 A1* | 10/2023 | Yang | H01L 27/14643 |

FOREIGN PATENT DOCUMENTS

CN       109638026 A  *  4/2019  ......... H01L 27/1463

* cited by examiner

*Primary Examiner* — Evan G Clinton
(74) *Attorney, Agent, or Firm* — Sughrue Mion, PLLC

(57) ABSTRACT

An image sensor includes a substrate including a first surface, a second surface opposite to the first surface, and unit pixels, a deep device isolation portion disposed in the substrate to isolate the unit pixels from each other, and a transfer gate disposed on the first surface and in each of the unit pixels. The deep device isolation portion includes a first conductive pattern extending from the first surface toward the second surface, a first insulating pattern interposed between the first conductive pattern and the substrate, a second conductive pattern extending from the second surface toward the first conductive pattern, and a first fixed charge layer interposed between the second conductive pattern and the substrate.

21 Claims, 31 Drawing Sheets

IMAGE SENSOR AND METHOD OF MANUFACTURING THE SAME

CROSS-REFERENCE TO RELATED APPLICATION

This application is based on and claims priority under 35 U.S.C. § 119 to Korean Patent Application No. 10-2020-0164117, filed on Nov. 30, 2020, in the Korean Intellectual Property Office, the disclosure of which is incorporated by reference herein in its entirety.

BACKGROUND

Embodiments of the inventive concepts relate to an image sensor and a method of manufacturing the same.

Image sensors are semiconductor devices for converting optical images into electrical signals. Image sensors may be categorized as any one of charge coupled device (CCD) image sensors and complementary metal-oxide-semiconductor (CMOS) image sensors. CIS is short for the CMOS image sensor. The CIS may include a plurality of pixels two-dimensionally arranged. Each of the pixels may include a photodiode (PD). The photodiode may convert incident light into an electrical signal.

SUMMARY

Embodiments of the inventive concepts may provide an image sensor capable of improving photosensitivity and of reducing or minimizing a dark current.

Embodiments of the inventive concepts may also provide a method of manufacturing an image sensor, which is capable of improving a yield.

In an aspect, an image sensor includes a substrate including a first surface, a second surface opposite to the first surface, and unit pixels, a deep device isolation portion disposed in the substrate to isolate the unit pixels from each other, and a transfer gate disposed on the first surface and in each of the unit pixels. The deep device isolation portion includes a first conductive pattern extending from the first surface toward the second surface, a first insulating pattern interposed between the first conductive pattern and the substrate, a second conductive pattern extending from the second surface toward the first conductive pattern, and a first fixed charge layer interposed between the second conductive pattern and the substrate.

In an aspect, an image sensor a substrate including a first surface, and a second surface opposite to the first surface, a pixel array region, and an edge region, a deep device isolation portion disposed in the substrate and in the pixel array region to isolate unit pixels from each other, the deep device isolation portion extending into the edge region, a connection contact penetrating through a portion of the deep device isolation portion in the edge region, and a transfer gate disposed on the first surface and in each of the unit pixels. The deep device isolation portion includes a first conductive pattern extending from the first surface toward the second surface, a first insulating pattern interposed between the first conductive pattern and the substrate, a second conductive pattern extending from the second surface toward the first conductive pattern, and a first fixed charge layer interposed between the second conductive pattern and the substrate. The connection contact contacts both the first conductive pattern and the second conductive pattern.

In an aspect, an image sensor a substrate including a first surface, a second surface opposite to the first surface, and unit pixels, a deep device isolation portion disposed in the substrate to isolate the unit pixels from each other, and a transfer gate disposed on the first surface and in each of the unit pixels. The deep device isolation portion includes a first conductive pattern extending from the first surface toward the second surface, a first insulating pattern interposed between the first conductive pattern and the substrate, a second conductive pattern extending from the second surface toward the first conductive pattern, and a first fixed charge layer interposed between the second conductive pattern and the substrate. The second conductive pattern includes poly-silicon or silicon-germanium doped with boron.

In an aspect, a method of manufacturing an image sensor includes preparing a substrate including a first surface and a second surface opposite to the first surface, forming a first trench by etching a portion of the substrate that is adjacent to the first surface, forming a first isolation portion including a first conductive pattern spaced apart from the substrate in the first trench, and a first insulating pattern interposed between the first conductive pattern and the substrate, forming a transfer gate, first interconnection lines and a first interlayer insulating layer on the first surface, forming a second trench exposing the first conductive pattern by etching a portion of the substrate that is adjacent to the second surface, and forming a second isolation portion including a second conductive pattern spaced apart from the substrate in the second trench, and a first fixed charge layer interposed between the second conductive pattern and the substrate.

BRIEF DESCRIPTION OF THE DRAWINGS

The inventive concepts will become more apparent in view of the attached drawings and accompanying detailed description.

DETAILED DESCRIPTION OF THE EMBODIMENTS

Hereinafter, embodiments of the inventive concepts will be described in more detail with reference to the accompanying drawings.

Figure 1:
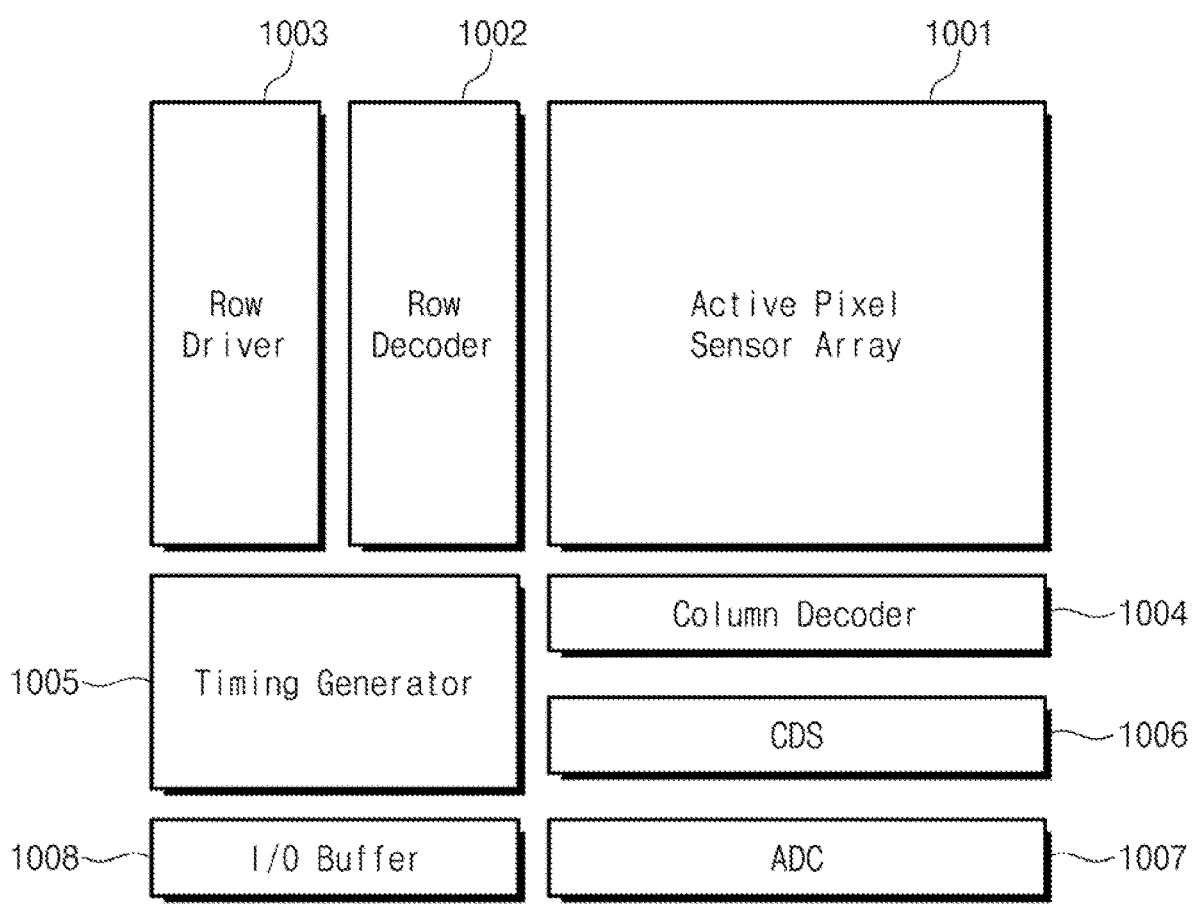
FIG. 1 is a schematic block diagram illustrating an image sensor according to embodiments of the inventive concepts.

FIG. 1 is a schematic block diagram illustrating an image sensor according to embodiments of the inventive concepts.

Referring to FIG. 1, an image sensor may include an active pixel sensor array 1001, a row decoder 1002, a row driver 1003, a column decoder 1004, a timing generator 1005, a correlated double sampler (CDS) 1006, an analog-to-digital converter (ADC) 1007, and an input/output (I/O) buffer 1008.

The active pixel sensor array 1001 may include a plurality of unit pixels two-dimensionally arranged and may convert optical signals into electrical signals. The active pixel sensor array 1001 may be driven by a plurality of driving signals (e.g., a pixel selection signal, a reset signal, and a charge transfer signal) provided from the row driver 1003. In addition, the converted electrical signals may be provided to the correlated double sampler 1006.

The row driver 1003 may provide a plurality of the driving signals for driving a plurality of the unit pixels to the active pixel sensor array 1001, in response to signals decoded in the row decoder 1002. When the unit pixels are arranged in a matrix form, the driving signals may be provided to each row of the matrix.

The timing generator 1005 may provide timing signals and control signals to the row decoder 1002 and the column decoder 1004.

The correlated double sampler 1006 may receive electrical signals generated from the active pixel sensor array 1001 and may hold and sample the received electrical signals. The correlated double sampler 1006 may doubly sample a noise level and a signal level of the electrical signal to output a difference level corresponding to a difference between the noise level and the signal level.

The analog-to-digital converter 1007 may convert an analog signal, which corresponds to the difference level outputted from the correlated double sampler 1006, into a digital signal and may output the digital signal.

The I/O buffer 1008 may latch the digital signals and may sequentially output the latched digital signals to an image signal processing unit in response to signals decoded in the column decoder 1004.

Figure 2:
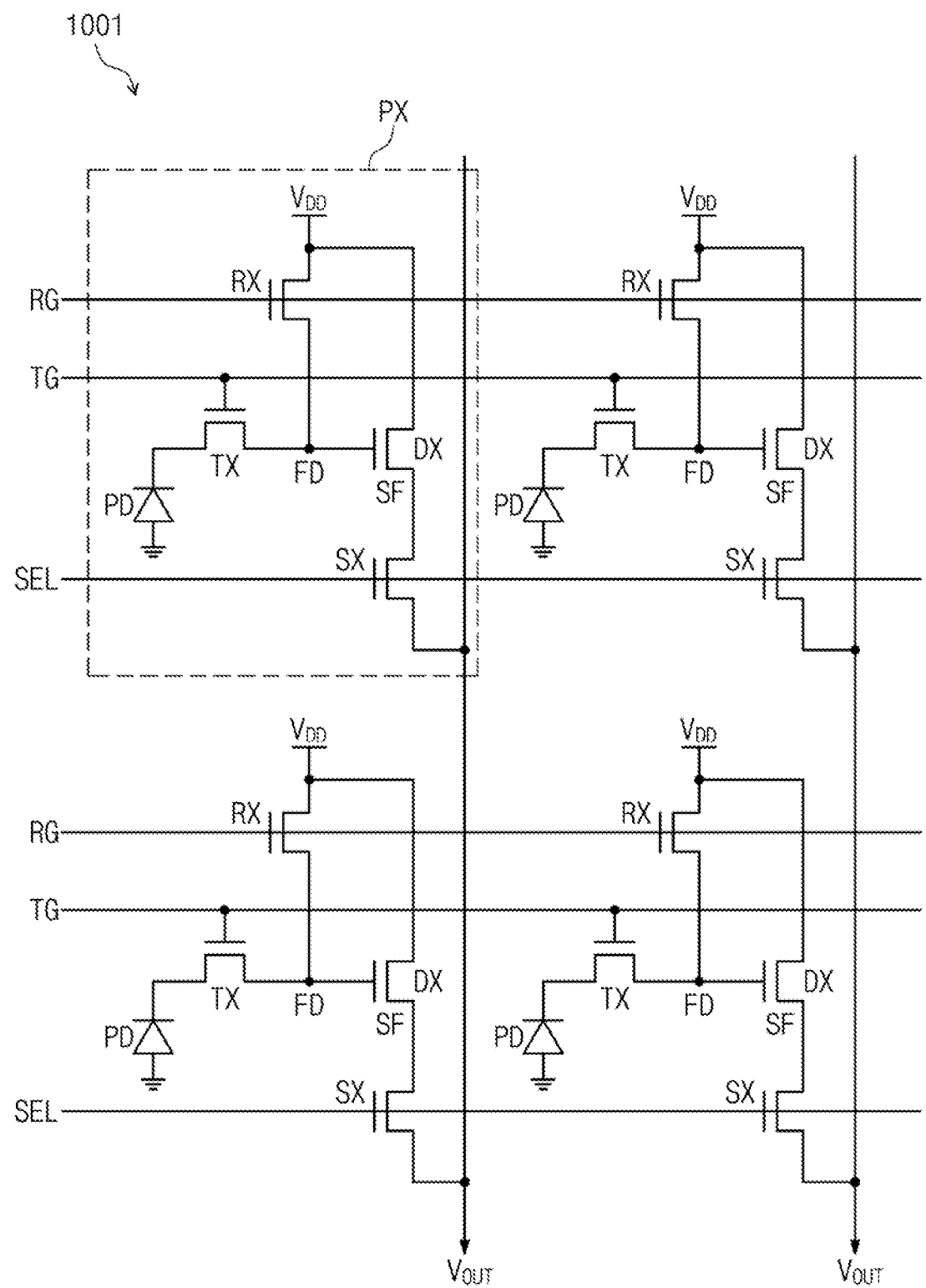
FIG. 2 is a circuit diagram illustrating an active pixel sensor array of an image sensor according to embodiments of the inventive concepts.

FIG. 2 is a circuit diagram illustrating an active pixel sensor array of an image sensor according to embodiments of the inventive concepts.

Referring to FIGS. 1 and 2, the active pixel sensor array 1001 may include a plurality of unit pixel regions PX, and the unit pixel regions PX may be arranged in a matrix form. Each of the unit pixel regions PX may include a transfer transistor TX and logic transistors RX, SX and DX. The logic transistors may include a reset transistor RX, a selection transistor SX, and a source follower transistor DX. The transfer transistor TX may include a transfer gate TG, and the reset transistor RX, the source follower transistor DX and the selection transistor SX may include a reset gate RG, a source follower gate SF and a selection gate SEL, respectively. Each of the unit pixel regions PX may further include a photoelectric conversion element PD and a floating diffusion region FD.

The photoelectric conversion element PD may generate photocharges (or charges) in proportion to the amount of light incident from the outside and may accumulate the generated photocharges. The photoelectric conversion element PD may include a photodiode, a photo transistor, a photo gate, a pinned photodiode, or a combination thereof. The transfer transistor TX may transfer charges generated in the photoelectric conversion element PD to the floating diffusion region FD. The floating diffusion region FD may receive the charges generated in the photoelectric conversion element PD and may cumulatively store the received charges. The source follower transistor DX may be controlled according to the amount of the photocharges accumulated in the floating diffusion region FD.

The reset transistor RX may periodically reset the charges accumulated in the floating diffusion region FD. A drain electrode of the reset transistor RX may be connected to the floating diffusion region FD, and a source electrode of the reset transistor RX may be connected to a power voltage $V_{DD}$. When the reset transistor RX is turned-on, the power voltage $V_{DD}$ connected to the source electrode of the reset transistor RX may be applied to the floating diffusion region FD. Thus, when the reset transistor RX is turned-on, the charges accumulated in the floating diffusion region FD may be discharged to reset the floating diffusion region FD.

The source follower transistor DX may function as a source follower buffer amplifier. The source follower transistor DX may amplify a potential change in the floating diffusion region FD and may output the amplified potential change to an output line $V_{OUT}$.

The selection transistor SX may select the unit pixel regions PX to be sensed in the unit of row. When the selection transistor SX is turned-on, the power voltage $V_{DD}$ may be applied to a drain electrode of the source follower transistor DX.

Figure 3:
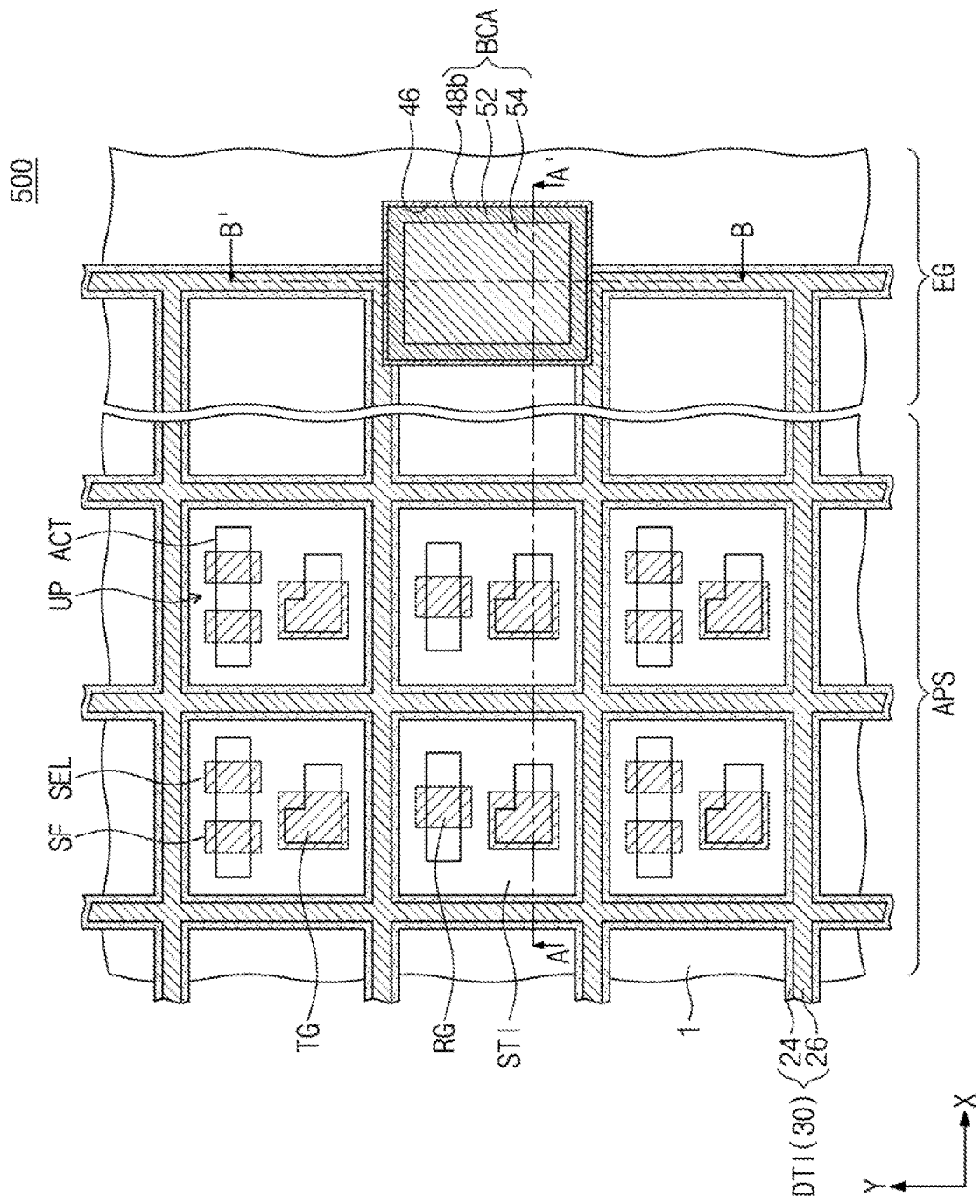
FIG. 3 is a plan view illustrating an image sensor according to embodiments of the inventive concepts.
Figure 4A:
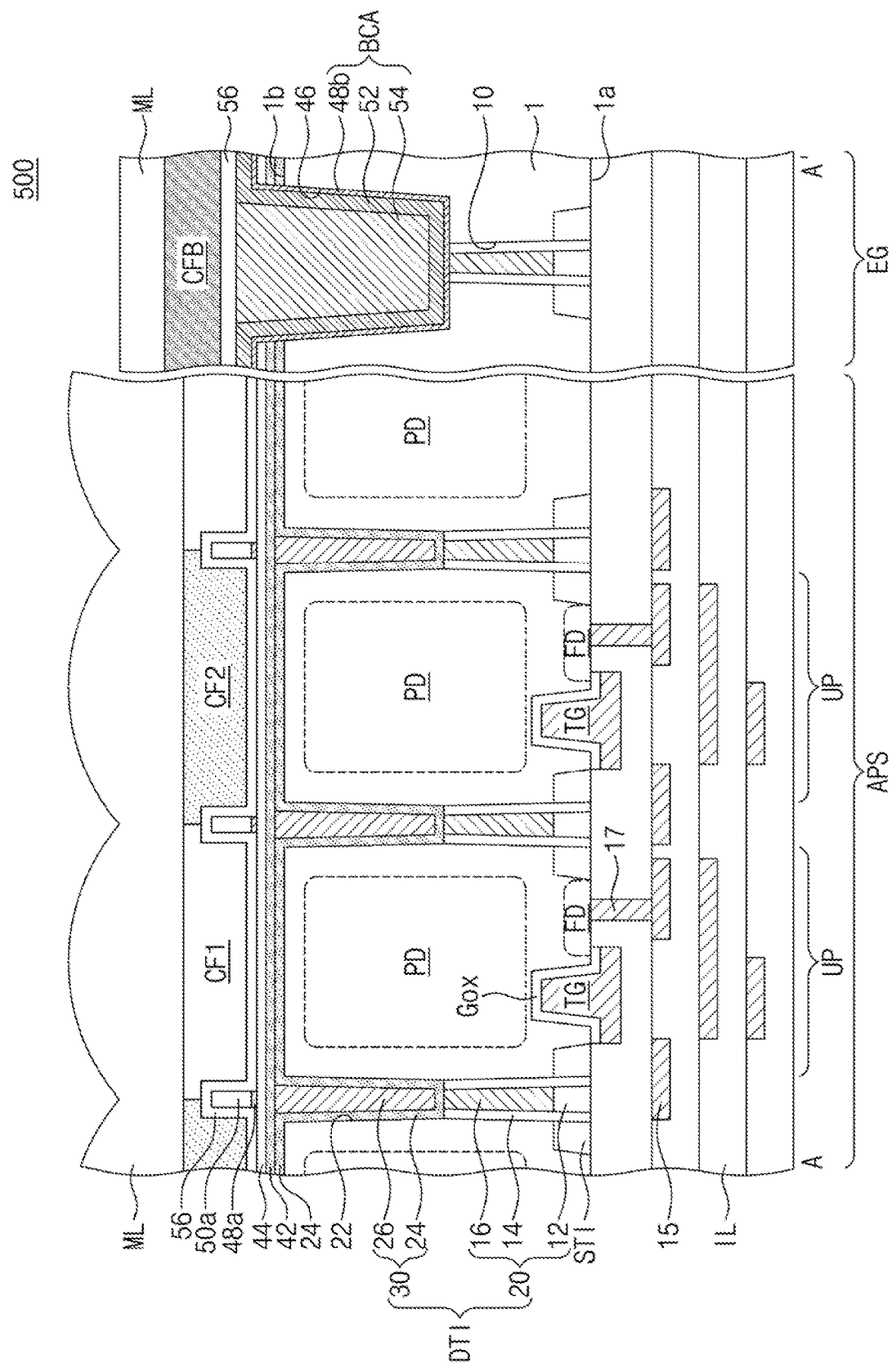
FIG. 4A is a cross-sectional view taken along a line A-A' of FIG. 3 according to embodiments of the inventive concepts.
Figure 4B:
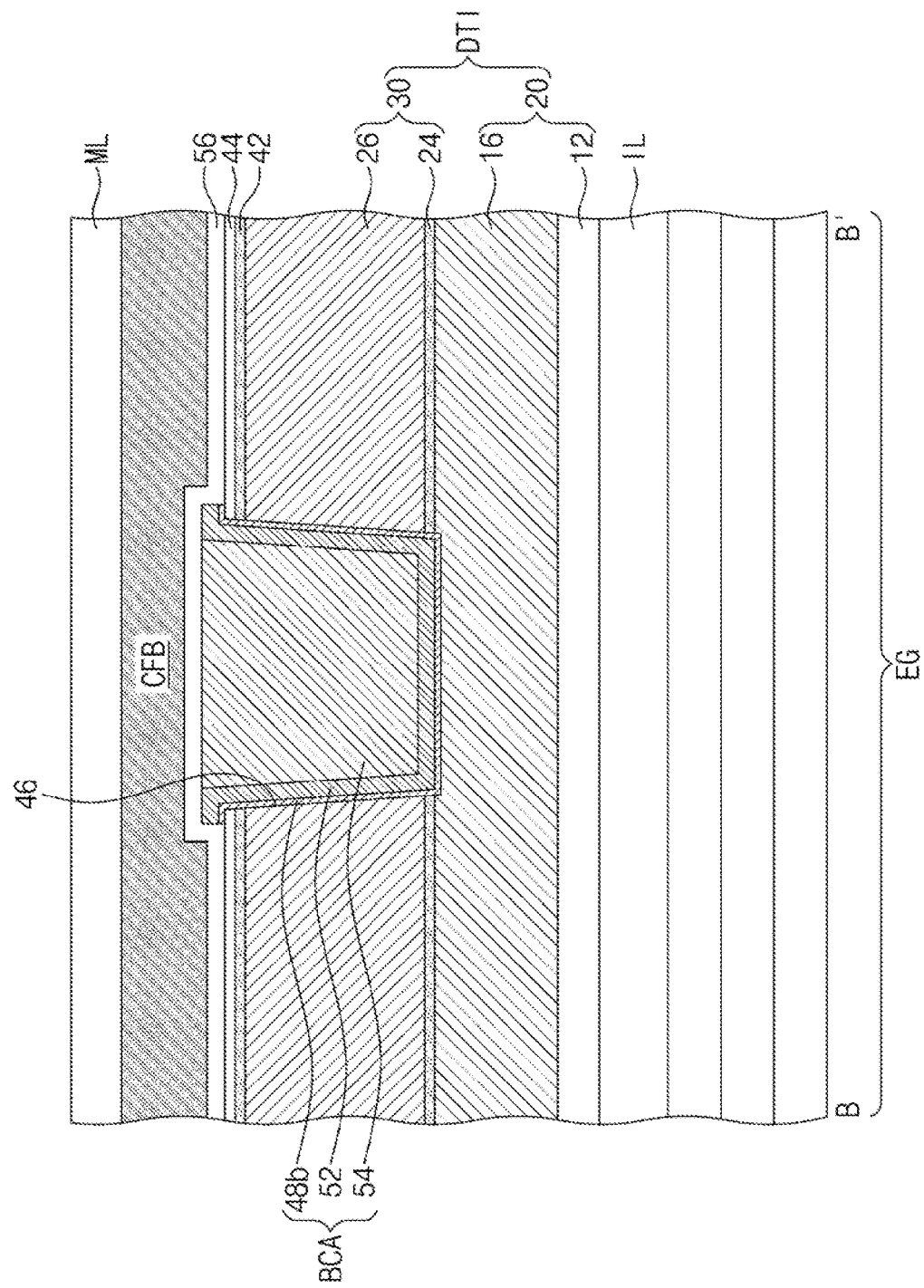
FIG. 4B is a cross-sectional view taken along a line B-B' of FIG. 3 according to embodiments of the inventive concepts.

FIG. 3 is a plan view illustrating an image sensor according to embodiments of the inventive concepts. FIG. 4A is a cross-sectional view taken along a line A-A' of FIG. 3 according to embodiments of the inventive concepts. FIG. 4B is a cross-sectional view taken along a line B-B' of FIG. 3 according to embodiments of the inventive concepts.

Referring to FIGS. 3, 4A and 4B, an image sensor 500 according to embodiments of the inventive concepts may include a first substrate 1. For example, the first substrate 1 may be a single-crystalline silicon wafer, a silicon epitaxial layer, or a silicon-on-insulator (SOI) substrate. For example, the first substrate 1 may be doped with dopants of a first conductivity type. For example, the first conductivity type may be a P-type. The first substrate 1 may include a first surface 1a and a second surface 1b that are opposite to each other. The first substrate 1 may include a pixel array region APS and an edge region EG. The pixel array region APS may include a plurality of unit pixels UP. The edge region EG may correspond to a portion of a connection region CNR of FIGS. 18, 19A and 19B.

A deep device isolation portion DTI may be disposed in the first substrate 1 to isolate/define the unit pixels UP in the pixel array region APS. The deep device isolation portion DTI may extend into the edge region EG. The deep device isolation portion DTI may have a mesh shape when viewed in a plan view.

A photoelectric conversion portion PD may be disposed in the first substrate 1 of each of the unit pixels UP. The photoelectric conversion portions PD may be doped with dopants of a second conductivity type opposite to the first conductivity type. The second conductivity type may be, for example, an N-type. The N-type dopants included in the photoelectric conversion portion PD may form a PN junction with the P-type dopants included in the first substrate 1 around the photoelectric conversion portion PD, and thus a photodiode may be provided.

A shallow device isolation portion STI adjacent to the first surface 1a may be disposed in the first substrate 1. The deep device isolation portion DTI may penetrate the shallow device isolation portion STI. The shallow device isolation portion STI may define active regions ACT adjacent to the first surface 1a in each of the unit pixels UP. The active regions ACT may be provided for the transistors TX, RX, DX and SX of FIG. 2.

A transfer gate TG may be disposed on the first surface 1a of the first substrate 1 of each of the unit pixels UP. A portion of the transfer gate TG may extend into the first substrate 1. The transfer gate TG may be a vertical type gate. Alternatively, the transfer gate TG may not extend into the first substrate 1 but may be a planar type gate having a flat shape. A gate insulating layer Gox may be interposed between the transfer gate TG and the first substrate 1. A floating diffusion region FD may be disposed in the first substrate 1 at a side of the transfer gate TG. For example, the floating diffusion region FD may be doped with dopants of the second conductivity type.

The image sensor 500 may be a backside illuminated image sensor. Light may be incident into the first substrate 1 through the second surface 1b of the first substrate 1. Electron-hole pairs (EHPs) may be generated in a depletion region of the PN junction by the incident light. The generated electrons may move into the photoelectric conversion portion PD. When a voltage is applied to the transfer gate TG, the electrons may be moved into the floating diffusion region FD.

In one unit pixel UP, the reset gate RG may be disposed on the first surface 1a and may be adjacent to the transfer gate TG. In another unit pixel UP, a source follower gate SF and the selection gate SEL may be disposed on the first surface 1a and may be adjacent to the transfer gate TG. The gates TG, RG, SF and SEL may correspond to gates of the transistors TX, RX, DX and SX of FIG. 2, respectively. The gates TG, RG, SF and SEL may overlap with the active regions ACT.

The first surface 1a may be covered with first interlayer insulating layers IL. Each of the first interlayer insulating layers IL may include any one or any combination of a silicon oxide layer, a silicon nitride layer, a silicon oxynitride layer, and a porous low-k dielectric layer. First interconnection lines 15 may be interposed between or in the first interlayer insulating layers IL. The floating diffusion regions FD may be connected to the first interconnection lines 15 through first contact plugs 17. The first contact plug 17 may penetrate one of the first interlayer insulating layers IL, which is closest to the first surface 1a in the pixel array region APS.

The deep device isolation portion DTI may include a first isolation portion 20 adjacent to the first surface 1a and a second isolation portion 30 adjacent to the second surface 1b. The first isolation portion 20 may be in contact with the second isolation portion 30. The first isolation portion 20 may be disposed in a first trench 10 formed from the first surface 1a toward the second surface 1b. The first isolation portion 20 may penetrate the shallow device isolation portion STI.

The first isolation portion 20 may include a first insulating pattern 12, a second insulating pattern 14, and a first conductive pattern 16. The first insulating pattern 12 may be interposed between the first conductive pattern 16 and the first interlayer insulating layer IL. The second insulating pattern 14 may be interposed between the first conductive pattern 16 and the first substrate 1 and between the first insulating pattern 12 and the first substrate 1. The second insulating pattern 14 may be formed of an insulating material having a different refractive index from that of the first substrate 1. The first insulating pattern 12 and/or the second insulating pattern 14 may include, for example, silicon oxide. The first conductive pattern 16 may be spaced apart from the first substrate 1. The first conductive pattern 16 may include a poly-silicon layer or silicon-germanium layer doped with dopants. The dopants doped in the poly-silicon layer or silicon-germanium layer may be, for example, boron, phosphorus, or arsenic. Alternatively, the first conductive pattern 16 may include a metal layer.

The second isolation portion 30 may be disposed in a second trench 22 formed from the second surface 1b toward the first surface 1a. The second isolation portion 30 may include a first fixed charge layer 24 and a second conductive pattern 26. The first fixed charge layer 24 may be formed of a single layer or multi-layer including any one or any combination of a metal oxide layer containing insufficient oxygen in terms of a stoichiometric ratio and a metal fluoride layer containing insufficient fluorine in terms of a stoichiometric ratio. Thus, the first fixed charge layer 24 may have negative fixed charges. The first fixed charge layer 24 may be formed of a single layer or multi-layer including a metal oxide layer and/or metal fluoride layer including any one or any combination of hafnium (Hf), zirconium (Zr), aluminum (Al), tantalum (Ta), titanium (Ti), yttrium (Y), and a lanthanoid. For example, the first fixed charge layer 24 may include a hafnium oxide layer and/or an aluminum oxide layer. A dark current and a white spot may be minimized or prevented by the first fixed charge layer 24.

The first fixed charge layer 24 may also be referred to as 'an insulating liner'. Alternatively, instead of the first fixed charge layer 24, an insulating liner may be interposed between the second conductive pattern 26 and the first substrate 1. In this case, the insulating liner may include a silicon oxide layer.

The first fixed charge layer 24 may be in contact with a surface of the first substrate 1. The first fixed charge layer 24 may cover an inner sidewall of the second trench 22 and may extend to cover the second surface 1b. In addition, the first fixed charge layer 24 may be interposed between the second conductive pattern 26 and the first conductive pattern 16. The first fixed charge layer 24 may be in contact with the second insulating pattern 14. The second conductive pattern 26 may be spaced apart from the first substrate 1. The second conductive pattern 26 may include a poly-silicon layer or silicon-germanium layer doped with dopants. The dopants doped in the poly-silicon layer or silicon-germanium layer may be, for example, boron, phosphorus, or arsenic. Alternatively, the second conductive pattern 26 may include a metal layer. The second conductive pattern 26 may include a poly-silicon layer or silicon-germanium layer doped with boron. In the present embodiments, the second conductive pattern 26 may protrude from the second surface 1b.

The second conductive pattern 26 may be the same as or different from the first conductive pattern 16. For example, the first conductive pattern 16 may include a metal, and the second conductive pattern 26 may include poly-silicon or silicon-germanium doped with dopants. When the first and second conductive patterns 16 and 26 include dopants, the kinds and/or concentrations of the dopants of the first and second conductive patterns 16 and 26 may be the same as or different from each other. For example, when the first and second conductive patterns 16 and 26 include poly-silicon or silicon-germanium doped with boron, a boron concentration in the first conductive pattern 16 may be equal to or different from a boron concentration in the second conductive pattern 26.

A second fixed charge layer 42 and a first protective layer 44 may be sequentially stacked on the second surface 1b. The second fixed charge layer 42 may include a single layer or multi-layer including any one or any combination of a metal oxide layer and a metal fluoride layer. For example, the second fixed charge layer 42 may include a hafnium oxide layer and/or an aluminum oxide layer. The second fixed charge layer 42 may reinforce the first fixed charge layer 24 or may function as an adhesive layer. For example, the first protective layer 44 may include any one or any combination of PETEOS, SiOC, $SiO_2$, and SiN. The first protective layer 44 may function as an anti-reflection layer and/or a planarization layer.

Referring to FIGS. 4A and 4B, in the edge region EG, a connection contact BCA may penetrate through the first protective layer 44, the second fixed charge layer 42, the second conductive pattern 26, the first fixed charge layer 24 and a portion of the first substrate 1 to contact with the first conductive pattern 16 and the second insulating pattern 14. The connection contact BCA may be disposed in a third trench 46. The connection contact BCA may include a diffusion barrier pattern 48b conformally covering an inner sidewall and a bottom surface of the third trench 46, a first metal pattern 52 on the diffusion barrier pattern 48b, and a second metal pattern 54 filling the third trench 46. The diffusion barrier pattern 48b may include, for example, titanium. The first metal pattern 52 may include, for example, tungsten. The second metal pattern 54 may include, for example, aluminum. The diffusion barrier pattern 48b and the first metal pattern 52 may extend onto the first protective layer 44 to be electrically connected to other interconnection lines or vias/contacts.

In the pixel array region APS, a light blocking pattern 48a and a low-refractive index pattern 50a may be sequentially stacked on the first protective layer 44. In the pixel array region APS, the light blocking pattern 48a and the low-refractive index pattern 50a may have mesh shapes in a plan view and may overlap with the deep device isolation portion DTI. The light blocking pattern 48a may have the same material and the same thickness as the diffusion barrier pattern 48b. The light blocking pattern 48a may include, for example, titanium. The low-refractive index pattern 50a may include an organic material. The low-refractive index pattern 50a may have a refractive index lower than those of color filters CF1 and CF2. For example, the low-refractive index pattern 50a may have a refractive index of about 1.3 or less. A sidewall of the low-refractive index pattern 50a may be aligned with a sidewall of the light blocking pattern 48a. The light blocking pattern 48a and the low-refractive index pattern 50a may prevent crosstalk between the unit pixels UP adjacent to each other.

A second protective layer 56 may be stacked on the first protective layer 44. The second protective layer 56 may conformally cover the low-refractive index pattern 50a, the light blocking pattern 48a, and the connection contact BCA. In the pixel array region APS, color filters CF1 and CF2 may be interposed between the low-refractive index patterns 50a. Each of the color filters CF1 and CF2 may have one of a blue color, a green color and a red color. The color filters CF1 and CF2 may be arranged in the form of a Bayer pattern, a 2×2 tetra pattern, or a 3×3 Nona pattern. In embodiments, each of the color filters CF1 and CF2 may have another color such as cyan, magenta or yellow.

In the edge region EG, a first optical black pattern CFB may be disposed on the second protective layer 56. For example, the first optical black pattern CFB may include the same material as the blue color filter. A micro lens array layer ML may be disposed on the color filters CF1 and CF2. The micro lens array layer ML may include convex lens portions overlapping with the unit pixels UP, respectively. A portion of the micro lens array layer ML may extend onto the first optical black pattern CFB.

In the present embodiments, the deep device isolation portion DTI may include the first isolation portion 20 extending from the first surface 1a toward the second surface 1b and the second isolation portion 30 extending from the second surface 1b toward the first surface 1a, and thus process defects may be reduced and a thickness of the first substrate 1 may be increased. As a result, a received amount of incident light may be increased, and photosensitivity may be improved.

In the present embodiments, because the deep device isolation portion DTI includes the first and second isolation portions 20 and 30 being in contact with each other, crosstalk between adjacent unit pixels UP may be prevented.

In addition, because the first and second isolation portions 20 and 30 may include the second insulating pattern 14, the first fixed charge layer 24 and the first and second conductive patterns 16 and 26, respectively, a negative bias voltage may be applied to the first and second conductive patterns 16 and 26 through the connection contact BCA. The first and second conductive patterns 16 and 26 may function as a common bias line. As a result, it is possible to capture holes that may exist at a surface of the first substrate 1 being in contact with the deep device isolation portion DTI, and thus a dark current may be reduced or minimized.

The second conductive pattern 26 included in the second isolation portion 30 may be formed of, for example, the poly-silicon or silicon-germanium doped with boron at a temperature of 400 degrees Celsius or less. As a result, the first interconnection lines 15 may not be damaged when the second conductive pattern 26 is formed, and thus reliability of the image sensor 500 may be improved.

FIGS. 5A, 5B, 5C, 5D, 5E and 5F are cross-sectional views illustrating a method of manufacturing an image sensor of FIG. 4A.

Figure 5A:
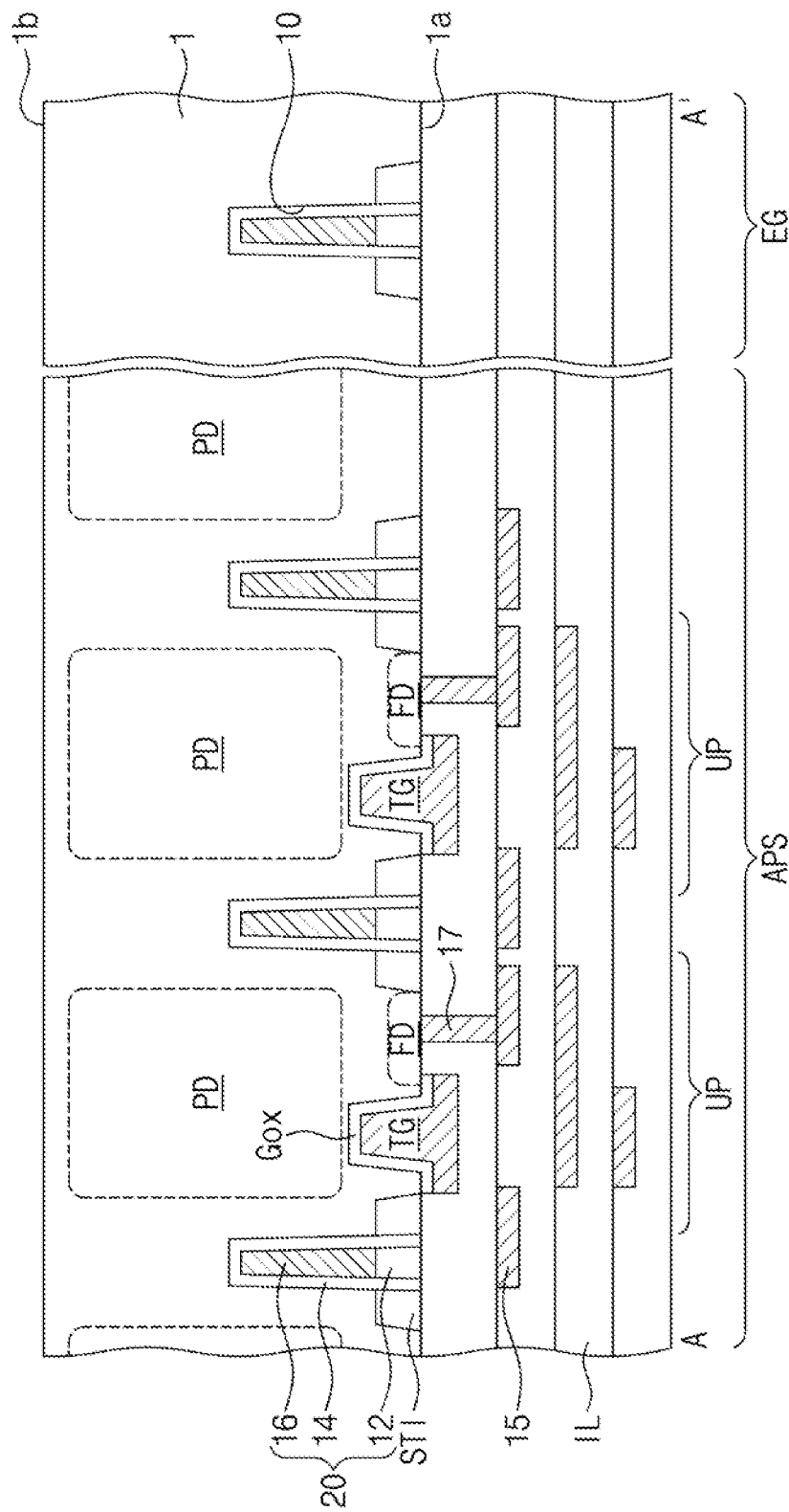
FIGS. 5A, 5B, 5C, 5D, 5E and 5F are cross-sectional views illustrating a method of manufacturing an image sensor of FIG. 4A.

Referring to FIG. 5A, a first substrate 1 including a pixel array region APS and an edge region EG may be prepared. An ion implantation process, for example, may be performed on the first substrate 1 to form photoelectric conversion portions PD. A shallow device isolation portion STI may be formed in a first surface 1a of the first substrate 1 to define active regions. The shallow device isolation portion STI may be formed by a shallow trench isolation process. A first trench 10 may be formed by etching the shallow device isolation portion STI and a portion of the first substrate 1. A first isolation portion 20 including first and second insulating patterns 12 and 14 and a first conductive pattern 16 may be formed in the first trench 10. A gate insulating layer Gox, transfer gates TG, floating diffusion regions FD, first contact plugs 17, first interconnection lines 15 and first interlayer insulating layers IL may be formed on the first surface 1a of the first substrate 1 through various processes.

Figure 5B:
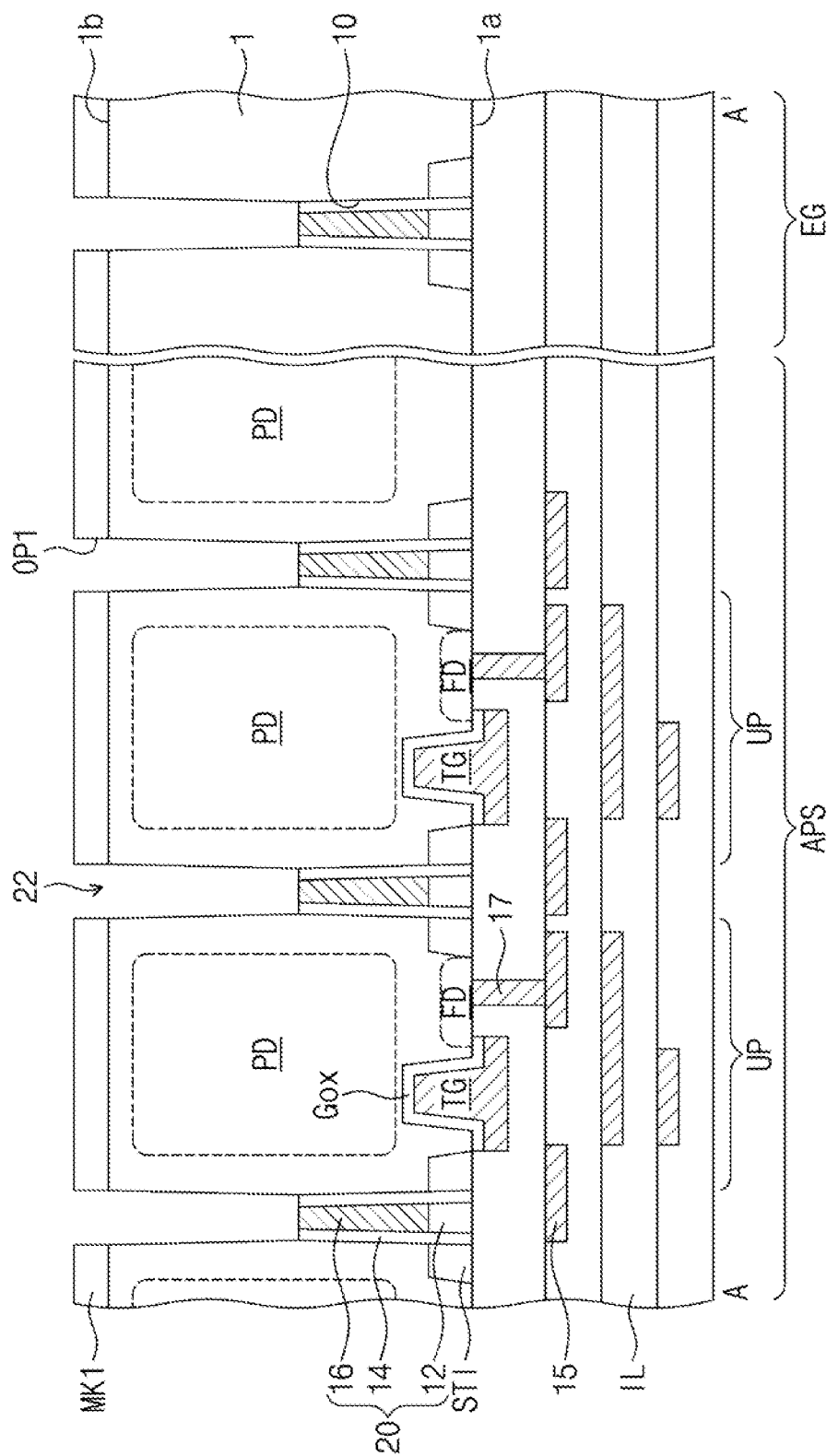

Referring to FIG. 5B, a first mask pattern MK1 may be formed on a second surface 1b of the first substrate 1. The first mask pattern MK1 may include any one or any combination of a photoresist pattern, a spin-on-hardmask (SOH) layer, an amorphous carbon layer (ACL), a silicon oxide layer, a silicon nitride layer, SiON, and SiOC. The first mask pattern MK1 may be formed to have a first opening OP1 overlapping with the first isolation portion 20. The first substrate 1 and a portion of the second insulating pattern 14 may be etched using the first mask pattern MK1 as an etch mask to form a second trench 22 exposing the first conductive pattern 16.

To form a deep device isolation portion, a deep trench may be formed in the first substrate 1 by a single etching process. As a thickness of the first substrate 1 increases to increase a received amount of light having long wavelengths, an etched thickness of the first substrate 1 in the formation of the deep trench may also be increased. Thus, it may be difficult to uniformly form the deep trench without process defects. However, according to the embodiments of the inventive concepts, the first trench 10 and the second trench 22 may be formed from both surfaces of the first substrate 1, respectively, and thus an etched thickness of the first substrate 1 may be reduced. Therefore, process defects may be reduced or minimized in the formation of the first and second trenches 10 and 22, and the thickness of the first substrate 1 may be relatively increased in the image sensor to increase a received amount of light having long wavelengths. As a result, photosensitivity may be improved.

Figure 5C:
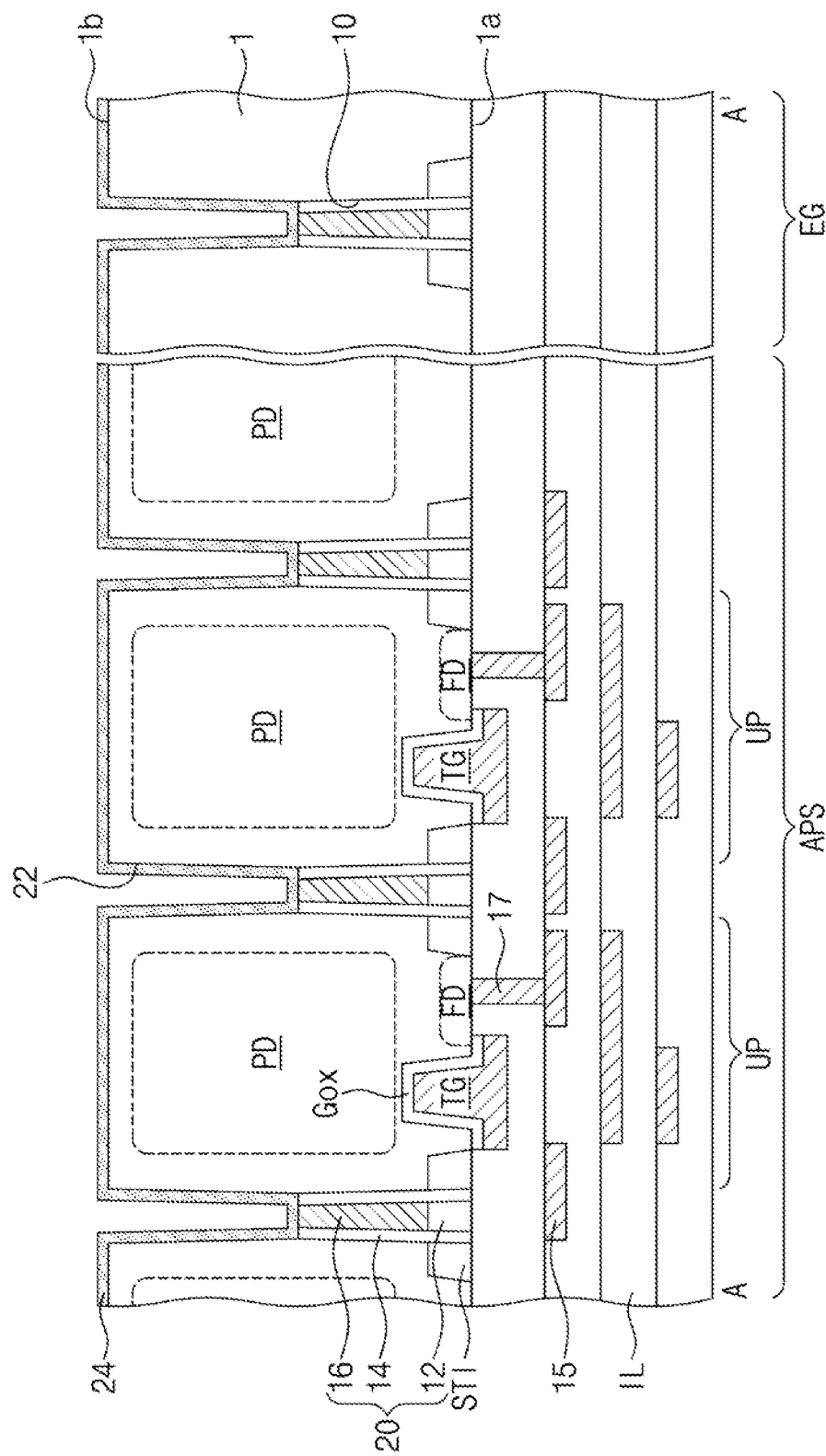

Referring to FIGS. 5B and 5C, the first mask pattern MK1 may be removed. A first fixed charge layer 24 may be conformally formed on the second surface 1b. The first fixed charge layer 24 may conformally cover an inner sidewall and a bottom surface of the second trench 22. The first fixed charge layer 24 may be in contact with the second insulating pattern 14 and the first conductive pattern 16.

Figure 5D:
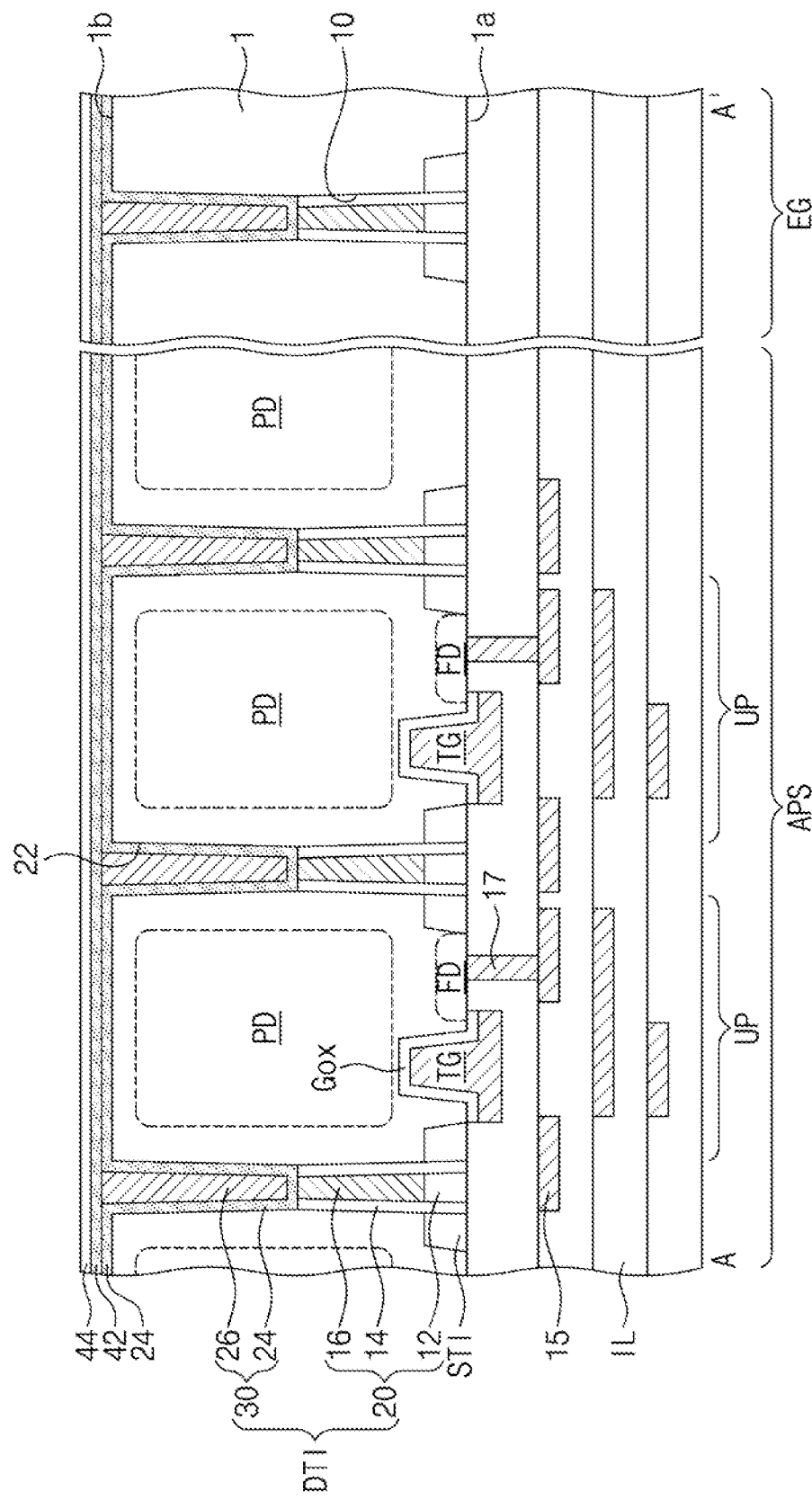

Referring to FIGS. 5C and 5D, a second conductive layer may be formed on the first fixed charge layer 24 to fill the second trench 22. An etch-back process may be performed on the second conductive layer to expose the first fixed charge layer 24 and to form a second conductive pattern 26 in the second trench 22.

The second conductive layer for forming the second conductive pattern 26 may be formed of, for example, a poly-silicon layer doped in-situ with boron. For example, the poly-silicon layer doped with boron may be formed by a low pressure chemical vapor deposition (LPCVD) or plasma-enhanced chemical vapor deposition (PECVD) process supplying a silicon precursor (e.g., monosilane ($SiH_4$) or disilane ($Si_2H_6$)) and a boron precursor (e.g., $BCl_3$ or $B_2H_6$) at a temperature of 200 degrees Celsius to 530 degrees Celsius (or at a temperature of 200 degrees Celsius to 400 degrees Celsius). A chemical formula in the process may be as follows.

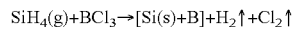

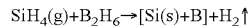

Alternatively, the second conductive layer for forming the second conductive pattern 26 may be formed of a silicon-germanium layer doped in-situ with boron. For example, the silicon-germanium layer doped with boron may be formed by a LPCVD or PECVD process supplying a silicon precursor (e.g., monosilane ($SiH_4$) or disilane ($Si_2H_6$)), a germanium precursor (e.g., $GeH_4$) and a boron precursor (e.g., $BCl_3$ or $B_2H_6$) at a temperature of 300 degrees Celsius to 750 degrees Celsius (or at a temperature of 300 degrees Celsius to 400 degrees Celsius).

The second conductive layer for forming the second conductive pattern 26 may be formed of the poly-silicon layer or silicon-germanium layer doped with boron at a temperature of 400 degrees Celsius, and thus the transistors TX, RX, DX and SX and the first interconnection lines 15 on the first surface 1a may not be damaged when the second conductive layer is formed. As a result, the reliability of the image sensor may be improved.

After the formation of the second conductive layer for forming the second conductive pattern 26, an annealing process may be additionally performed to activate the doped dopants (e.g., boron). At this time, the annealing process may be performed by selectively irradiating laser to a desired region while adjusting an irradiation depth of the laser. Thus, the annealing process may be performed without damaging the transistors TX, RX, DX and SX and the first interconnection lines 15 on the first surface 1a. As a result, the reliability of the image sensor may be improved.

Figure 5E:
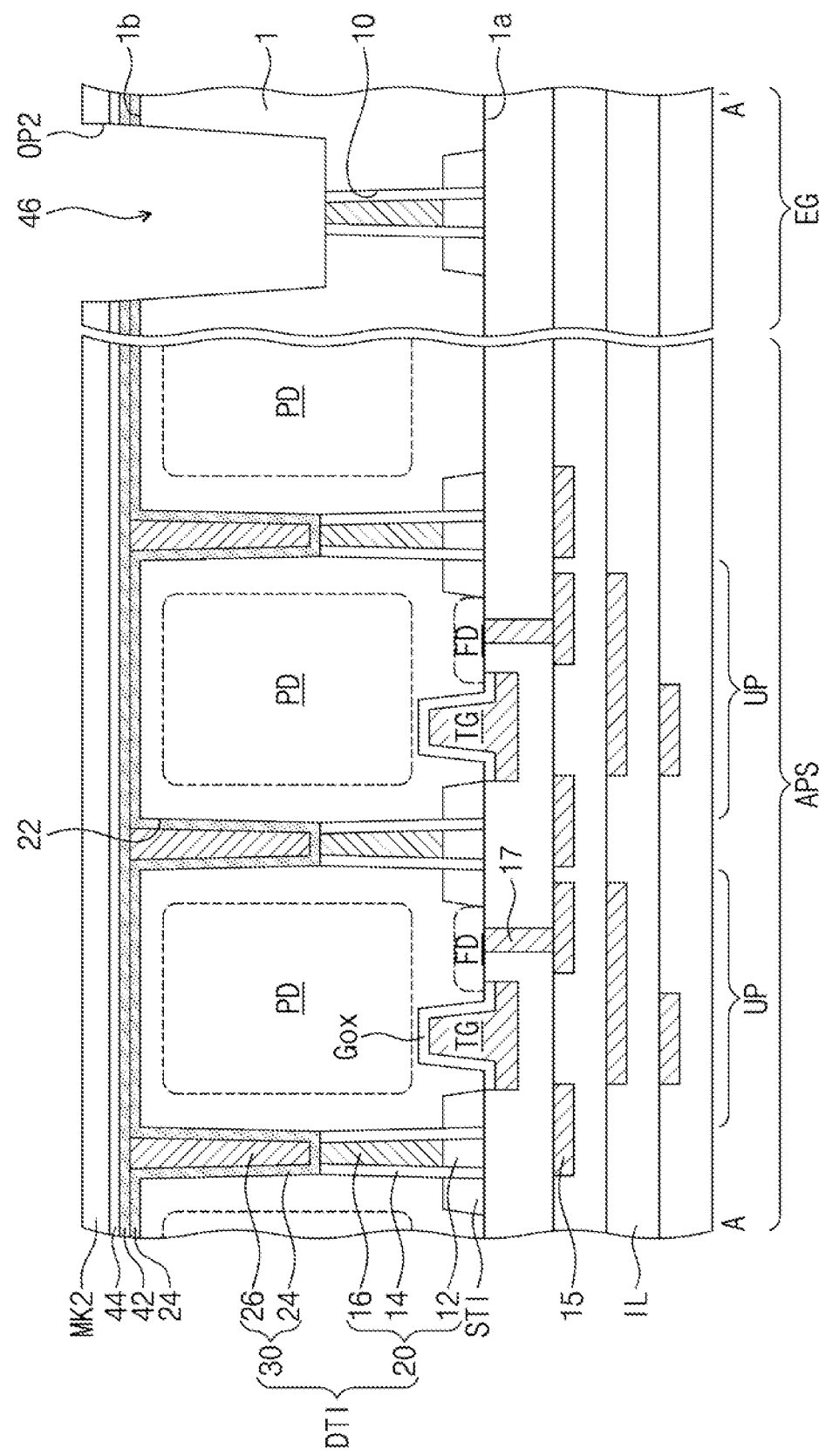

Referring to FIGS. 3, 5D and 5E, a second fixed charge layer 42 and a first protective layer 44 may be sequentially formed on the first fixed charge layer 24. A second mask pattern MK2 may be formed on the first protective layer 44. The second mask pattern MK2 may have a second opening OP2 exposing a portion of the edge region EG. The first protective layer 44, the second fixed charge layer 42, the second conductive pattern 26, the first fixed charge layer 24 and a portion of the first substrate 1 may be etched using the second mask pattern MK2 as an etch mask to form a third trench 46 exposing the first conductive pattern 16 and the second insulating pattern 14.

Figure 5F:
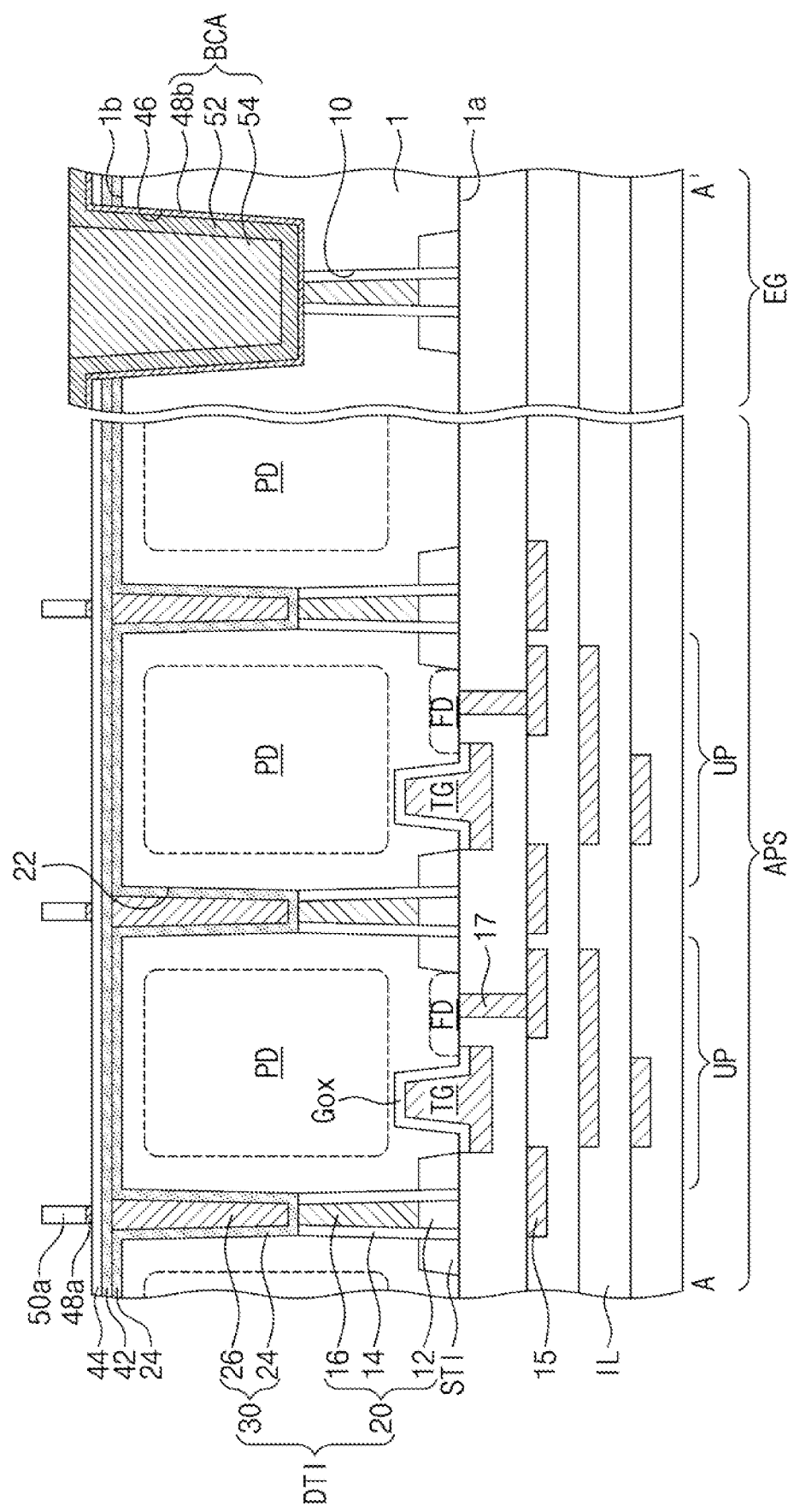

Referring to FIGS. 5E and 5F, the second mask pattern MK2 may be removed. A diffusion barrier layer and a first metal layer may be sequentially formed on the first protective layer 44. The first metal layer may be etched to form a first metal pattern 52 in the edge region EG. A low-refractive index pattern 50a may be formed on the diffusion barrier layer in the pixel array region APS. The diffusion barrier layer may be etched to form a light blocking pattern 48a in the pixel array region APS and a diffusion barrier pattern 48b in the edge region EG at the same time. A second metal pattern 54 filling the third trench 46 may be formed. The second metal pattern 54, the first metal pattern 52 and the diffusion barrier pattern 48b may constitute a connection contact BCA.

Subsequently, referring to FIG. 4A, a second protective layer 56 may be conformally formed on the first protective layer 44 and the connection contact BCA. Color filters CF1 and CF2 may be formed between the low-refractive index patterns 50a on the second protective layer 56. At this time, a first optical black pattern CFB may also be formed in the edge region EG. A micro lens array layer ML may be formed on the color filters CF1 and CF2 and the first optical black pattern CFB. Thus, the image sensor 500 of FIGS. 4A and 4B may be manufactured.

Figure 6:
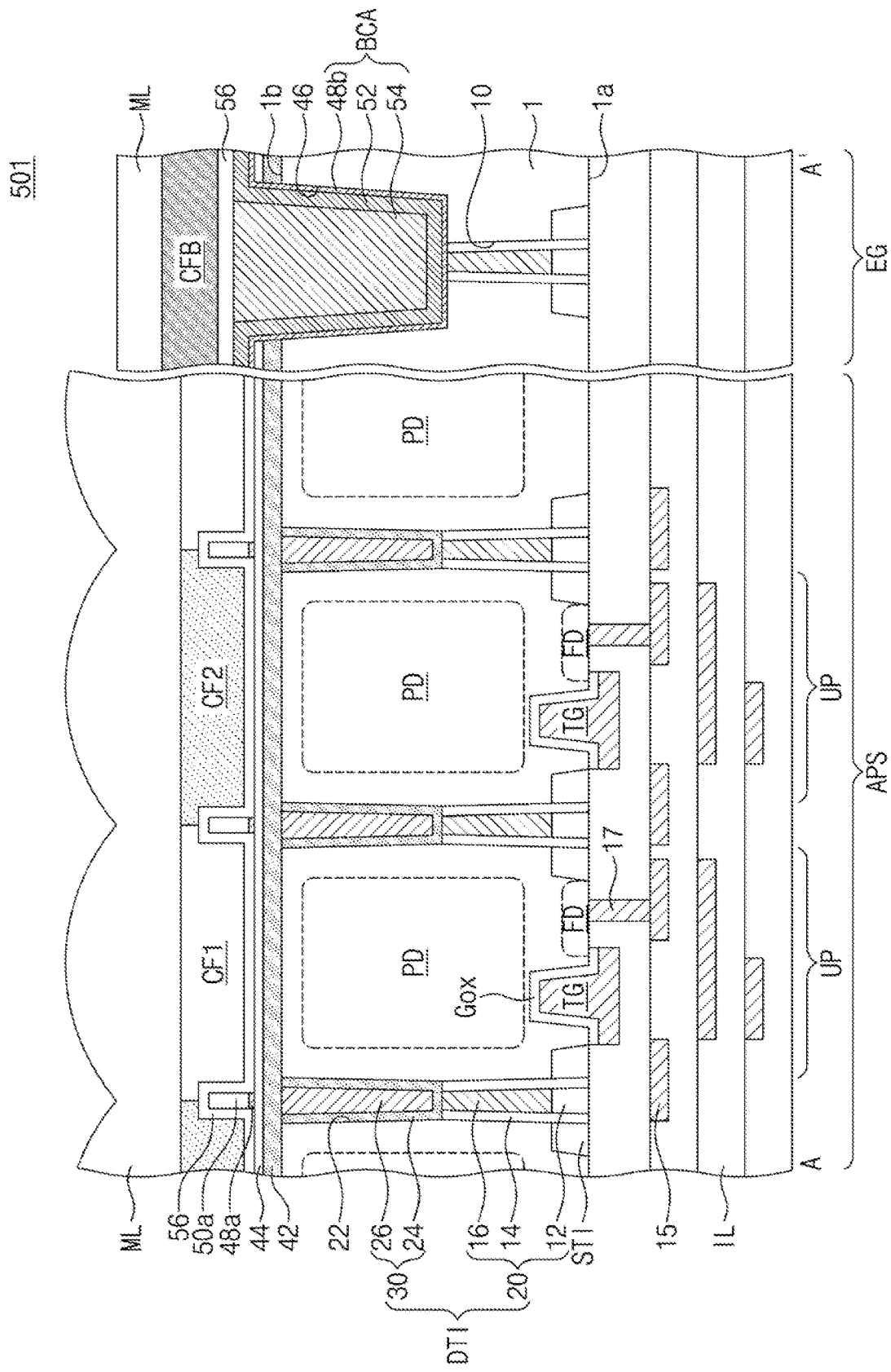
FIG. 6 is a cross-sectional view taken along the line A-A' of FIG. 3 according to embodiments of the inventive concepts.

FIG. 6 is a cross-sectional view taken along the line A-A' of FIG. 3 according to embodiments of the inventive concepts.

Referring to FIG. 6, in an image sensor 501 according to the present embodiments, a first fixed charge layer 24 may not be in contact with a second surface 1b. A second fixed charge layer 42 may be in contact with the second surface 1b. A second conductive pattern 26 may not protrude from the second surface 1b. Top surfaces of the second conductive pattern 26 and the first fixed charge layer 24 may be coplanar with the second surface 1b. Other components and structures may be the same/similar as described with reference to FIGS. 3, 4A and 4B.

A method of manufacturing the image sensor 501 of FIG. 6 may include forming a second conductive layer on the first fixed charge layer 24 in the state of FIG. 5C, and performing a chemical mechanical polishing (CMP) process on the second conductive layer and the first fixed charge layer 24 until the second surface 1b is exposed, thereby forming a second conductive pattern 26 while leaving a portion of the first fixed charge layer 24 in the second trench 22. Other manufacturing processes may be the same/similar as described with reference to FIGS. 5A to 5F.

Figure 7A:
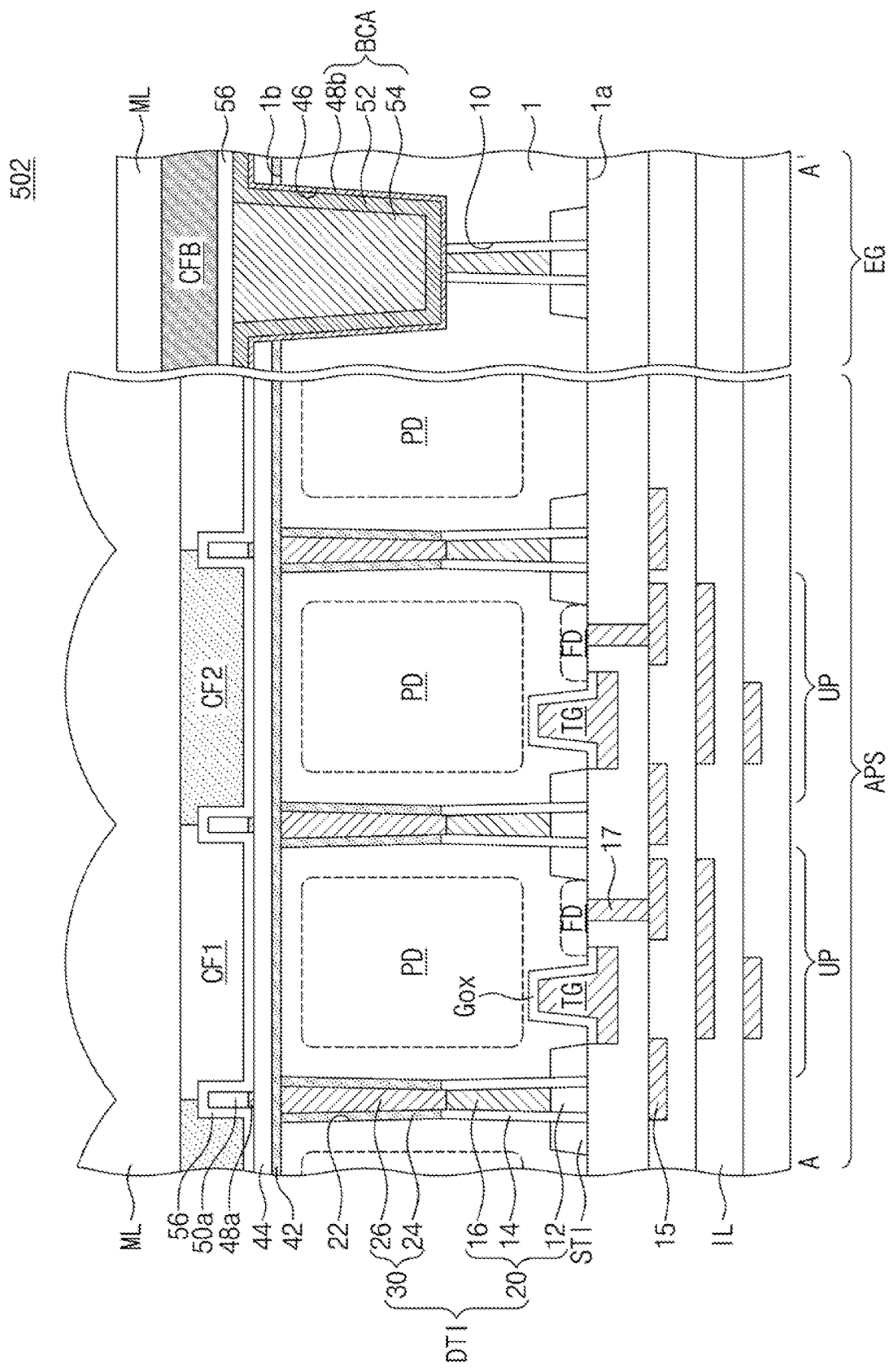
FIG. 7A is a cross-sectional view taken along the line A-A' of FIG. 3 according to embodiments of the inventive concepts.
Figure 7B:
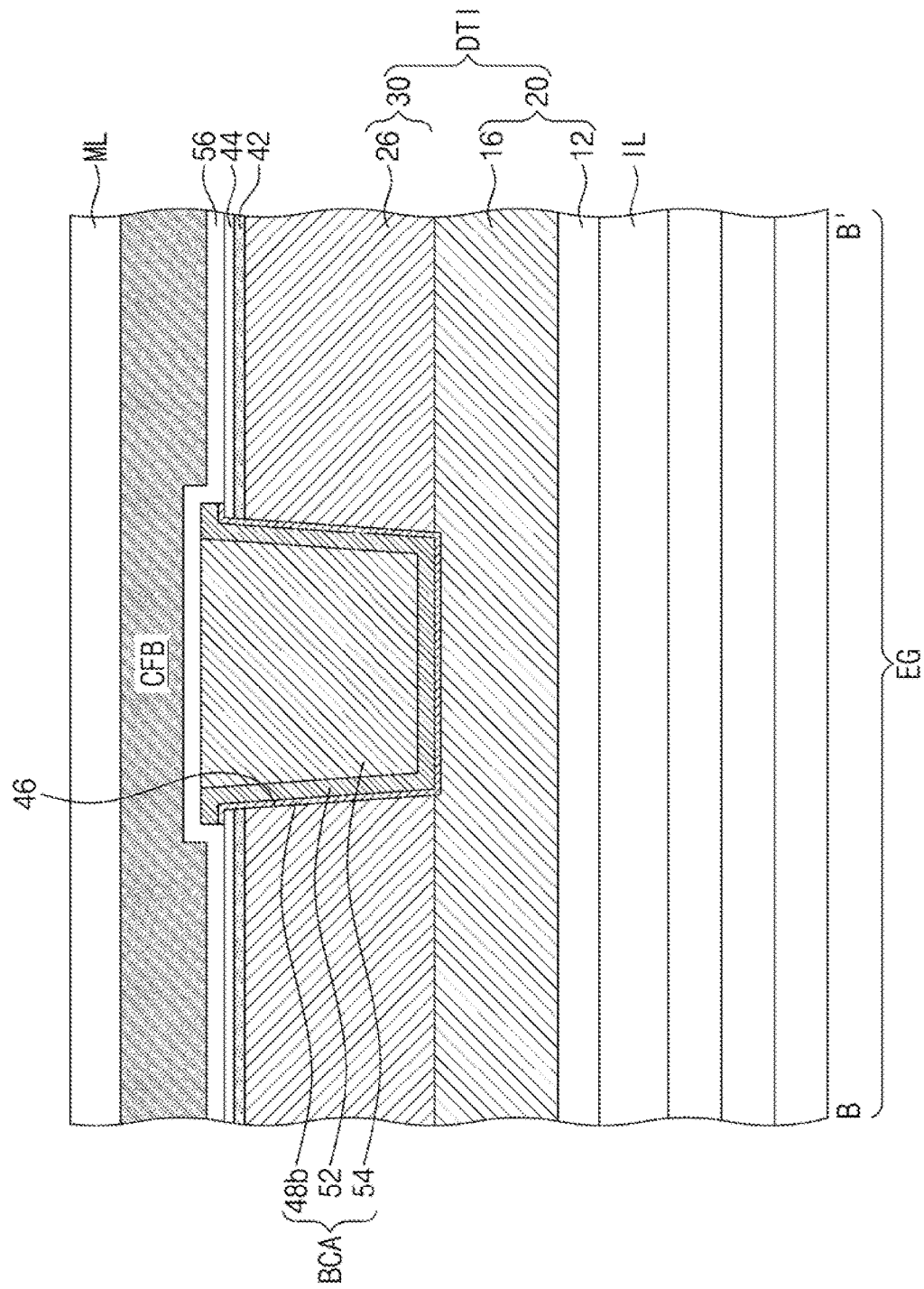
FIG. 7B is a cross-sectional view taken along the line B-B' of FIG. 3 according to embodiments of the inventive concepts.

FIG. 7A is a cross-sectional view taken along the line A-A' of FIG. 3 according to embodiments of the inventive concepts. FIG. 7B is a cross-sectional view taken along the line B-B' of FIG. 3 according to embodiments of the inventive concepts.

Referring to FIGS. 7A and 7B, in an image sensor 502 according to the present embodiments, a second conductive pattern 26 may penetrate the first fixed charge layer 24 in the structure of FIG. 6 and may be in contact with the first conductive pattern 16. The first fixed charge layer 24 may not be interposed between the first conductive pattern 16 and the second conductive pattern 26. A connection contact BCA may penetrate the second conductive pattern 26 to contact with the first conductive pattern 16. The second conductive pattern 26 may protrude downward from a bottom end of the first fixed charge layer 24. A bottom surface of the second conductive pattern 26 and/or a top surface of the first conductive pattern 16 may be lower than a top end of the second insulating pattern 14. Other components and structures may be the same/similar as described with reference to FIGS. 3, 4A and 4B.

The connection contact BCA may be in contact with the second conductive pattern 26 but may be spaced apart from the first conductive pattern 16 and the second insulating pattern 14. In this case, because the first and second conductive patterns 16 and 26 are in contact with each other, a negative voltage may also be applied to the first conductive pattern 16 through the connection contact BCA.

Figure 8:
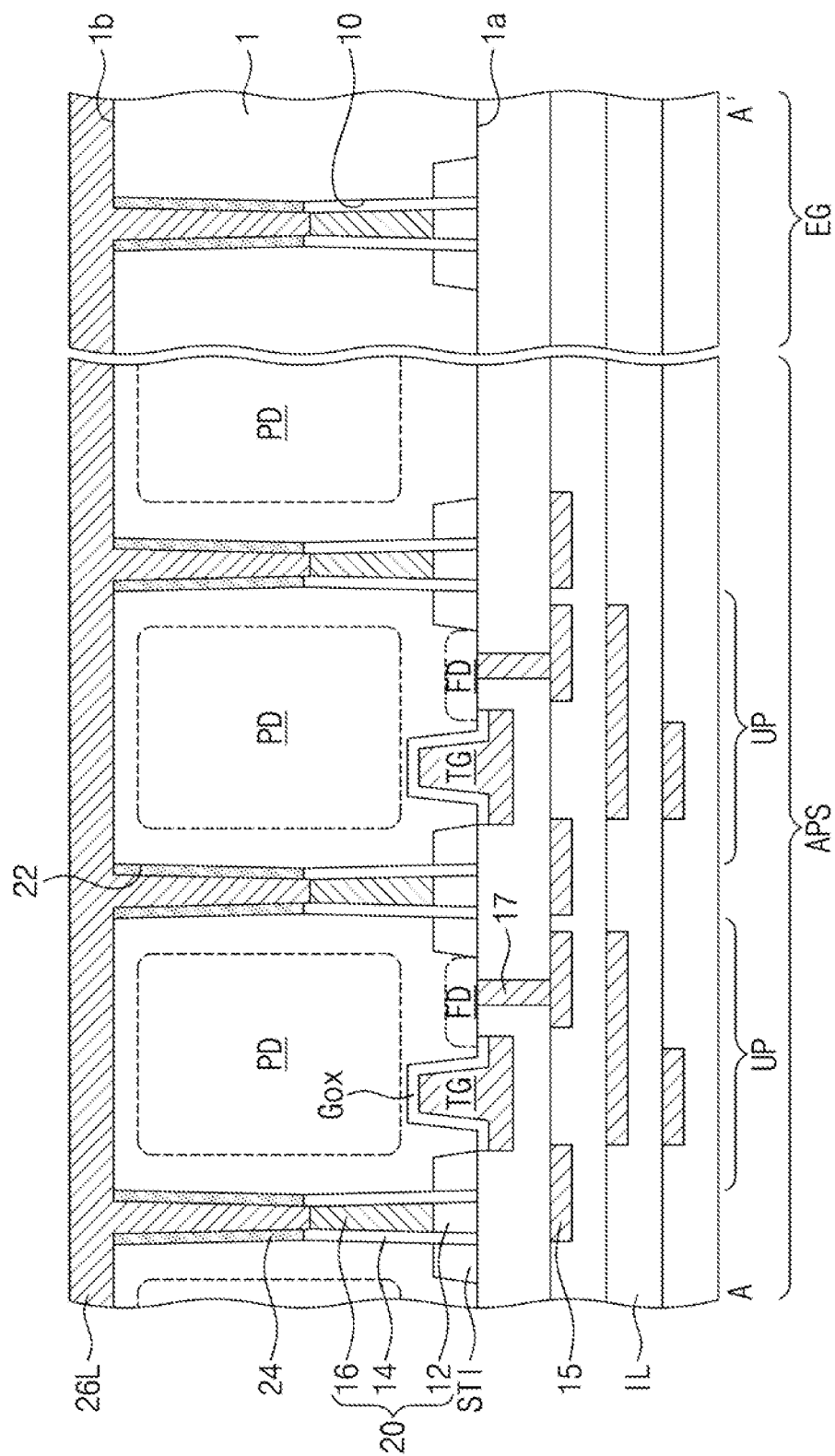
FIG. 8 is a cross-sectional view illustrating a method of manufacturing an image sensor of FIG. 7A.

FIG. 8 is a cross-sectional view illustrating a method of manufacturing an image sensor of FIG. 7A.

Referring to FIG. 8, an anisotropic etching process may be performed in the state of FIG. 5C to remove the first fixed charge layer 24 provided on the second surface 1b and the bottom surface of the second trench 22 while leaving the first fixed charge layer 24 covering the inner sidewall of the second trench 22. At this time, a portion of the first conductive pattern 16 may also be removed. Subsequently, a second conductive layer 26L may be formed on the second surface 1b to fill the second trench 22. The second conductive layer 26L may be in contact with the first conductive pattern 16. The second conductive layer 26L may be formed by the same/similar method as described with reference to FIGS. 5C and 5D. Other manufacturing processes may be the same/similar as described with reference to FIGS. 5A to 5F.

Figure 9A:
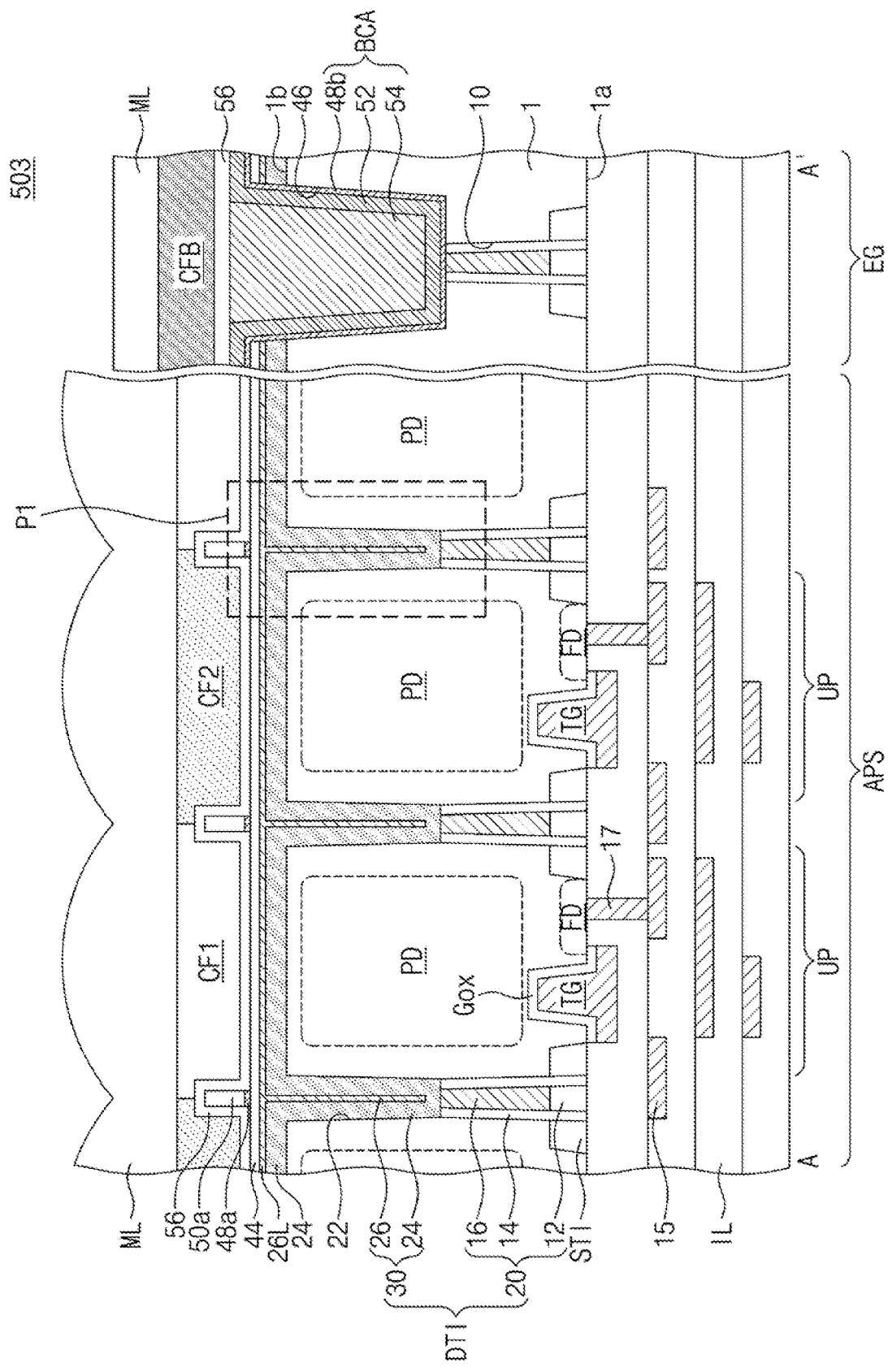
FIG. 9A is a cross-sectional view taken along the line A-A' of FIG. 3 according to embodiments of the inventive concepts.
Figure 9B:
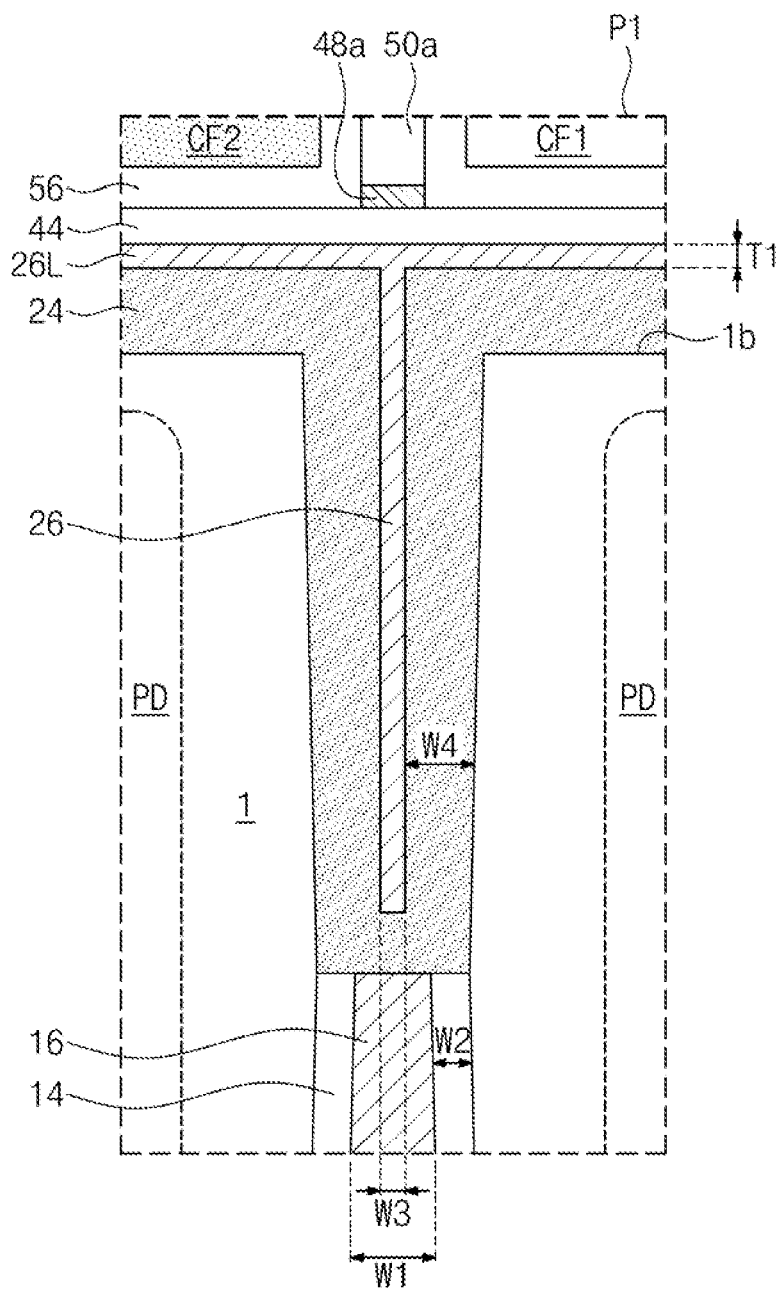
FIG. 9B is an enlarged view of a portion 'P1' of FIG. 9A according to embodiments of the inventive concepts.

FIG. 9A is a cross-sectional view taken along the line A-A' of FIG. 3 according to embodiments of the inventive concepts. FIG. 9B is an enlarged view of a portion 'P1' of FIG. 9A according to embodiments of the inventive concepts.

Referring to FIGS. 9A and 9B, in an image sensor 503 according to the present embodiments, a portion of a second conductive pattern 26 may extend onto a first fixed charge layer 24 in the structure of FIG. 4A to cover the first fixed charge layer 24. The portion of the second conductive pattern 26, which covers the first fixed charge layer 24, may be referred to as a second conductive layer 26L. In the present embodiments, the second fixed charge layer 42 of FIG. 4A may be omitted. A first protective layer 44 may be in direct contact with the second conductive layer 26L. The second conductive layer 26L may have a first thickness T1 on the second surface 1b. For example, the first thickness T1 may range from 5 Å to 100 Å. The first thickness T1 may be as thin as 100 Å or less, and thus the second conductive layer 26L may hardly affect light transmission. As a result, the second conductive layer 26L may hardly affect the amount of light incident to the photoelectric conversion portion PD.

In the present embodiments, the first conductive pattern 16 may have a first width W1. The second insulating pattern 14 may have a second width W2 on a sidewall of the first conductive pattern 16. The second conductive pattern 26 may have a third width W3. The first fixed charge layer 24 may have a fourth width W4 at a side of the second conductive pattern 26. For example, the third width W3 of the second conductive pattern 26 may range from 20 Å to 200 Å. If the third width W3 of the second conductive pattern 26 is less than 20 Å, an electrical resistance of the second conductive pattern 26 may be increased, and thus the second conductive pattern 26 may be difficult to function as a common bias line.

The third width W3 of the second conductive pattern 26 may be less than the first width W1 of the first conductive pattern 16. The third width W3 of the second conductive pattern 26 may be less than the fourth width W4 of the first fixed charge layer 24. The second width W2 of the second insulating pattern 14 may be less than the fourth width W4 of the first fixed charge layer 24. Other components and structures may be the same/similar as described with reference to FIGS. 3, 4A and 4B.

Figure 10:
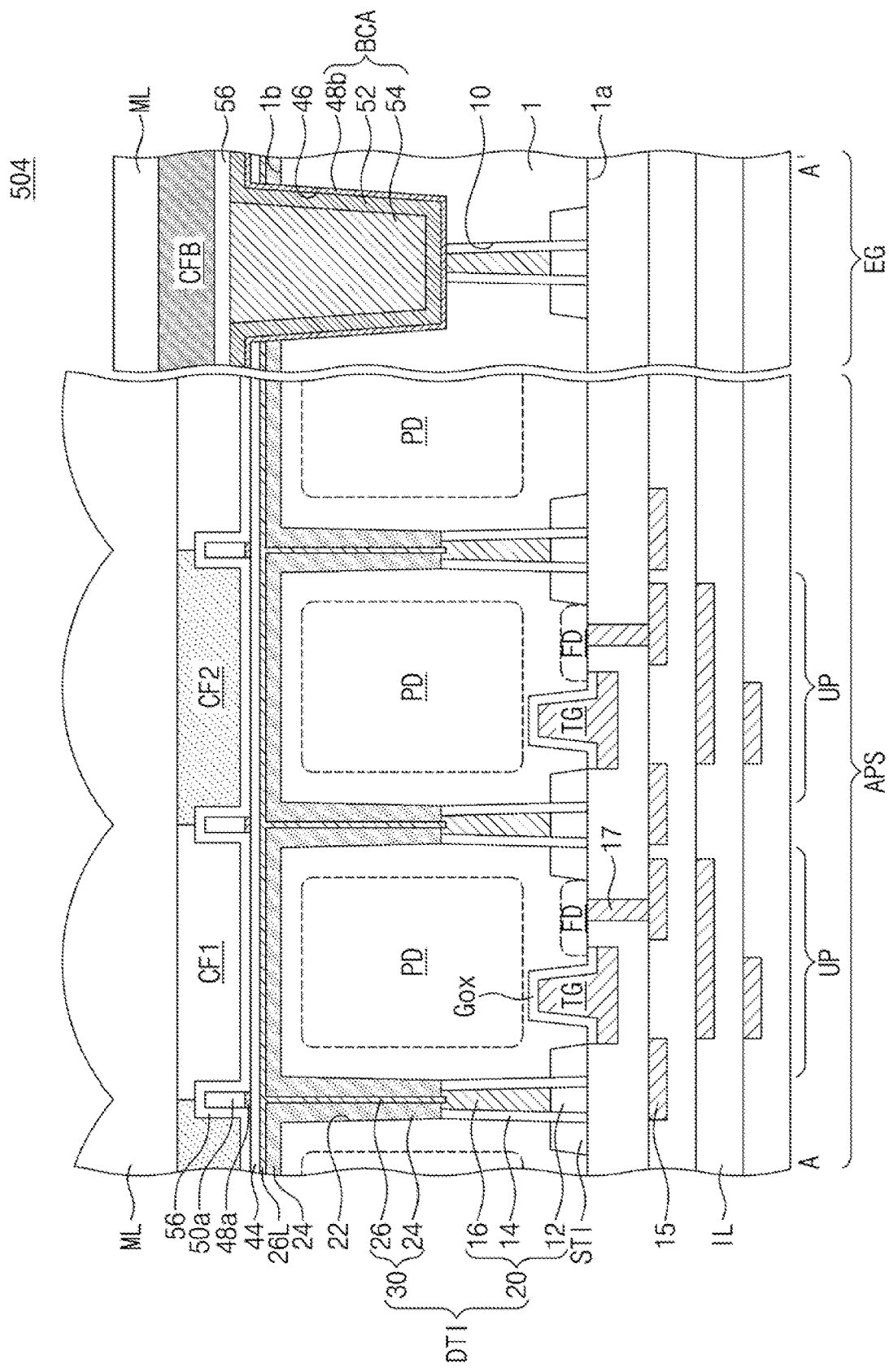
FIG. 10 is a cross-sectional view taken along the line A-A' of FIG. 3 according to embodiments of the inventive concepts.

FIG. 10 is a cross-sectional view taken along the line A-A' of FIG. 3 according to embodiments of the inventive concepts.

Referring to FIG. 10, in an image sensor 504 according to the present embodiments, the second conductive pattern 26 may penetrate the first fixed charge layer 24 in the state of FIG. 9A and may be in contact with the first conductive pattern 16. The second conductive pattern 26 may protrude downward from a bottom surface of the first fixed charge layer 24. The second conductive pattern 26 may be inserted into the first conductive pattern 16. Other components and structures may be the same/similar as described with reference to FIGS. 9A and 9B.

Figure 11:
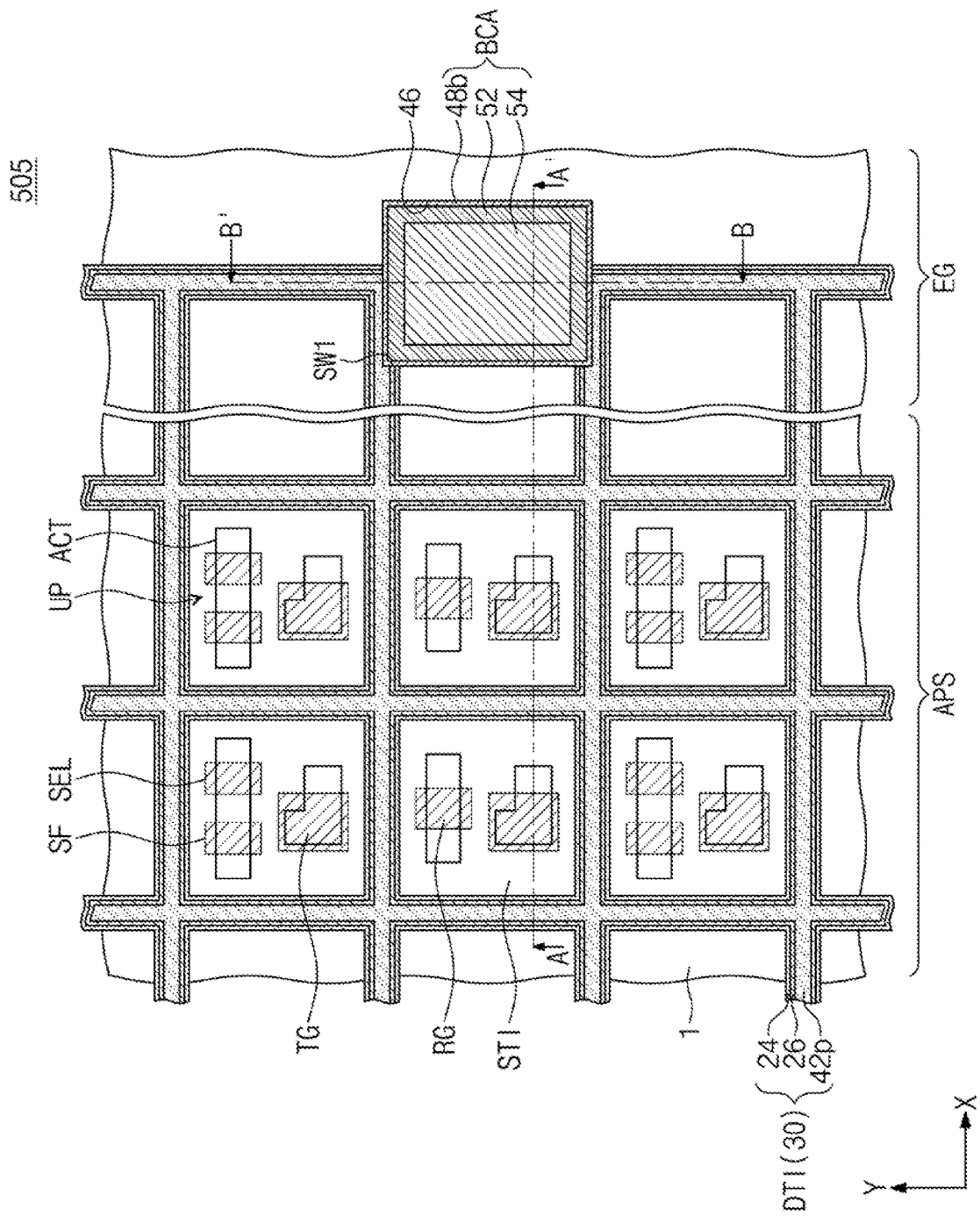
FIG. 11 is a plan view illustrating an image sensor according to embodiments of the inventive concepts.
Figure 12A:
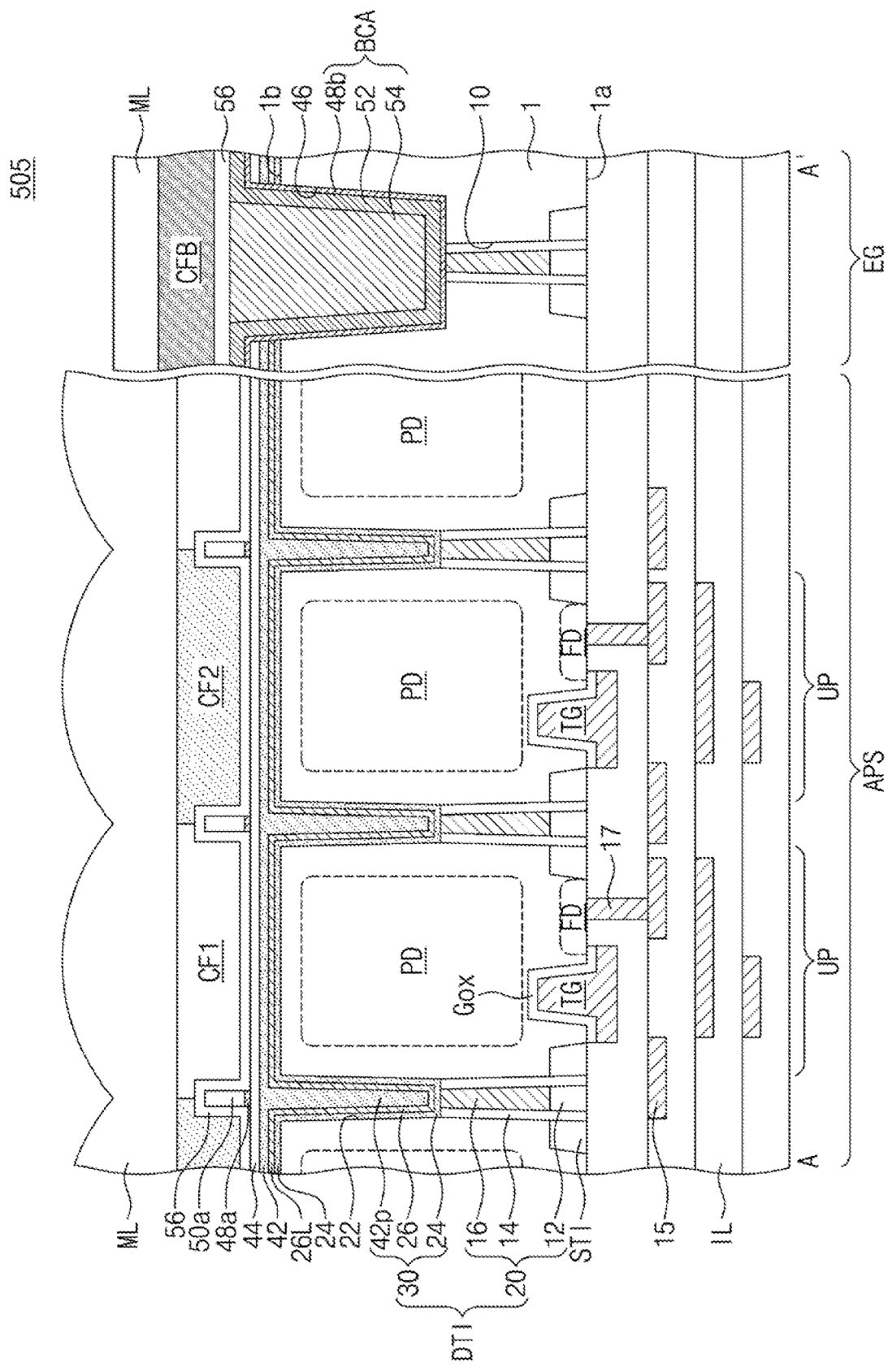
FIG. 12A is a cross-sectional view taken along a line A-A' of FIG. 11 according to embodiments of the inventive concepts.
Figure 12B:
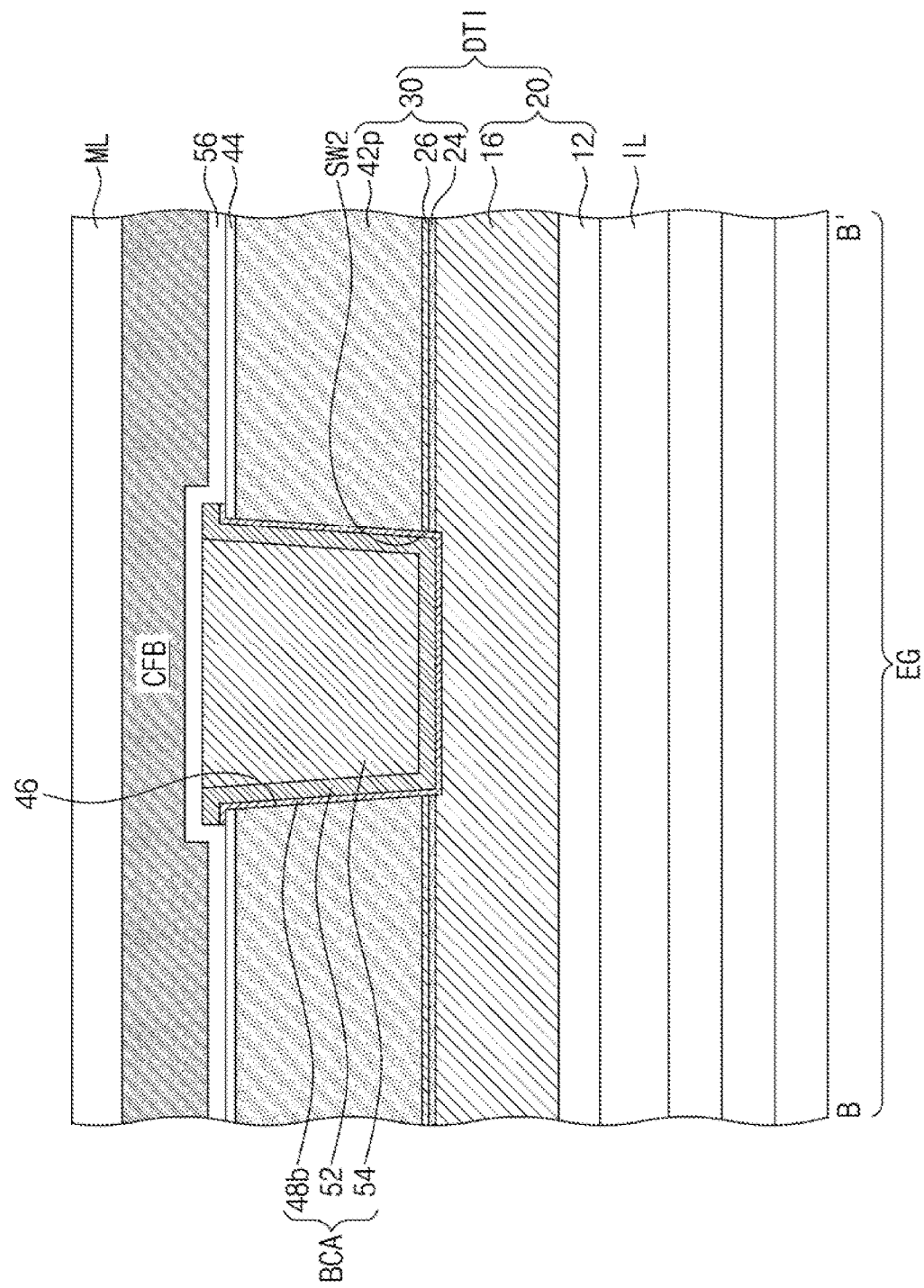
FIG. 12B is a cross-sectional view taken along a line B-B' of FIG. 11 according to embodiments of the inventive concepts.

FIG. 11 is a plan view illustrating an image sensor according to embodiments of the inventive concepts. FIG. 12A is a cross-sectional view taken along a line A-A' of FIG. 11 according to embodiments of the inventive concepts. FIG. 12B is a cross-sectional view taken along a line B-B' of FIG. 11 according to embodiments of the inventive concepts.

Referring to FIGS. 11, 12A and 12B, in an image sensor 505 according to the present embodiments, a first fixed charge layer 24 and a second conductive layer 26L may conformally cover the second surface 1b and the inside of the second trench 22. A second conductive pattern 26 that is a portion of the second conductive layer 26L may not completely fill the second trench 22. A second fixed charge layer 42 may be disposed on the second conductive layer 26L including a hollow cup or cylinder-shaped cross section. The second fixed charge layer 42 may extend to fill the second trench 22. Thus, a second isolation portion 30 of a deep device isolation portion DTI in the present embodiments may further include a portion 42p of the second fixed charge layer 42 filling an inside of the second conductive layer 26L. The second conductive layer 26L may have the first thickness T1 of FIG. 9B on the second surface 1b. For example, the first thickness T1 may range from 5 Å to 100 Å (i.e., may be 100 Å or less), and thus the second conductive layer 26L may not affect light transmission.

A connection contact BCA may penetrate the first protective layer 44, the portion 42p of the second fixed charge layer 42, the second conductive pattern 26 and the first fixed charge layer 24, to contact with the first conductive pattern 16. The connection contact BCA may be in contact with a first sidewall SW1 of the second conductive pattern 26 in the plan view of FIG. 11. The connection contact BCA may be in contact with a second sidewall SW2 of the second conductive pattern 26 in the cross-sectional view of FIG. 12B. Other components and structures may be the same/similar as described with reference to FIGS. 4A and 4B.

Figure 13:
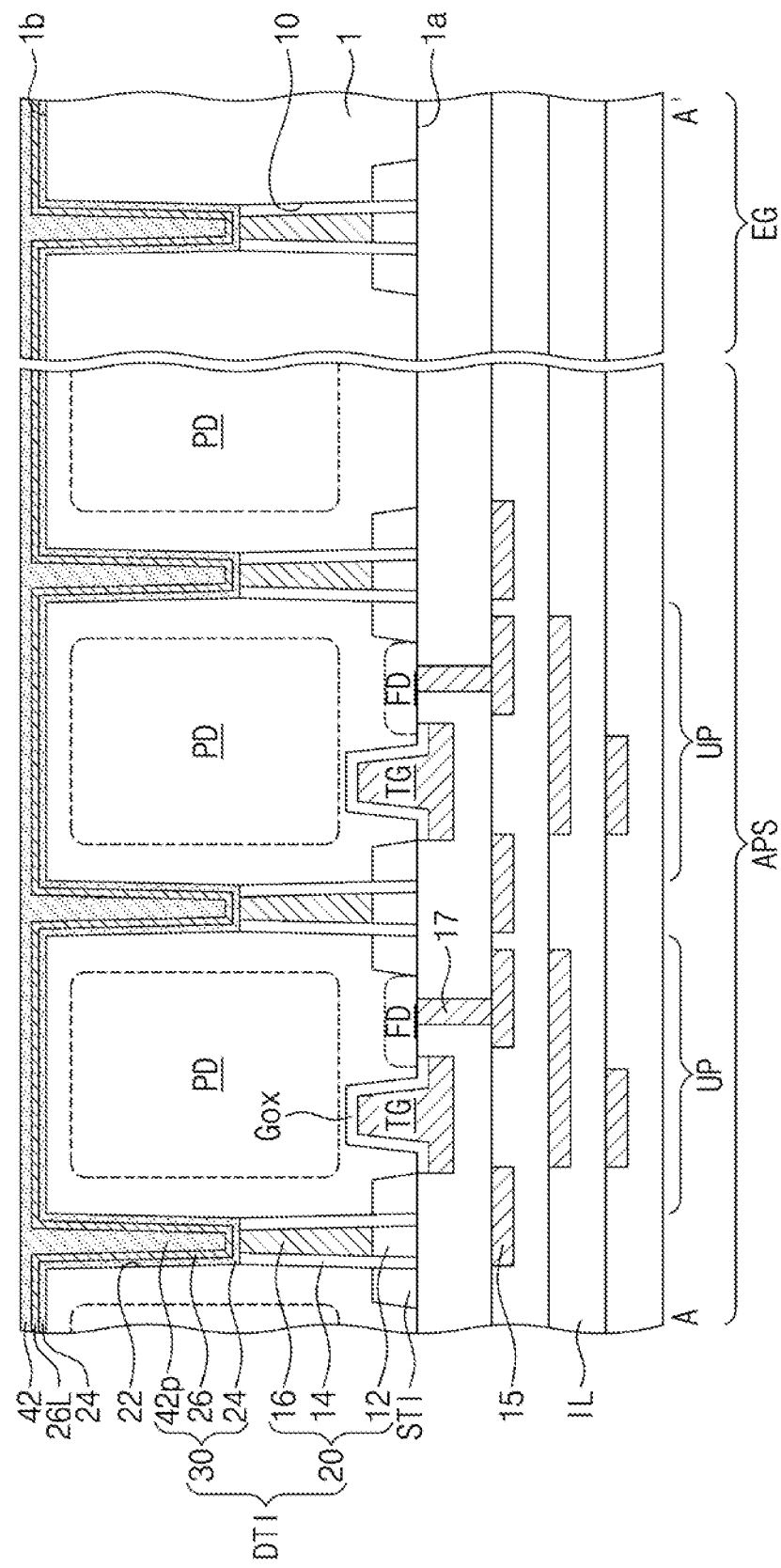
FIG. 13 is a cross-sectional view illustrating a method of manufacturing an image sensor of FIG. 12A.

FIG. 13 is a cross-sectional view illustrating a method of manufacturing an image sensor of FIG. 12A.

Referring to FIG. 13, a second conductive layer 26L may be conformally formed on the first fixed charge layer 24 in the state of FIG. 5C. At this time, the second conductive layer 26L may have a thickness that does not completely fill the second trench 22. For example, the thickness of the second conductive layer 26L may range from 5 Å to 100 Å. Subsequently, a second fixed charge layer 42 may be formed on the second conductive layer 26L to fill the second trench 22. Other manufacturing processes may be the same/similar as described with reference to FIGS. 5A to 5F.

Figure 14:
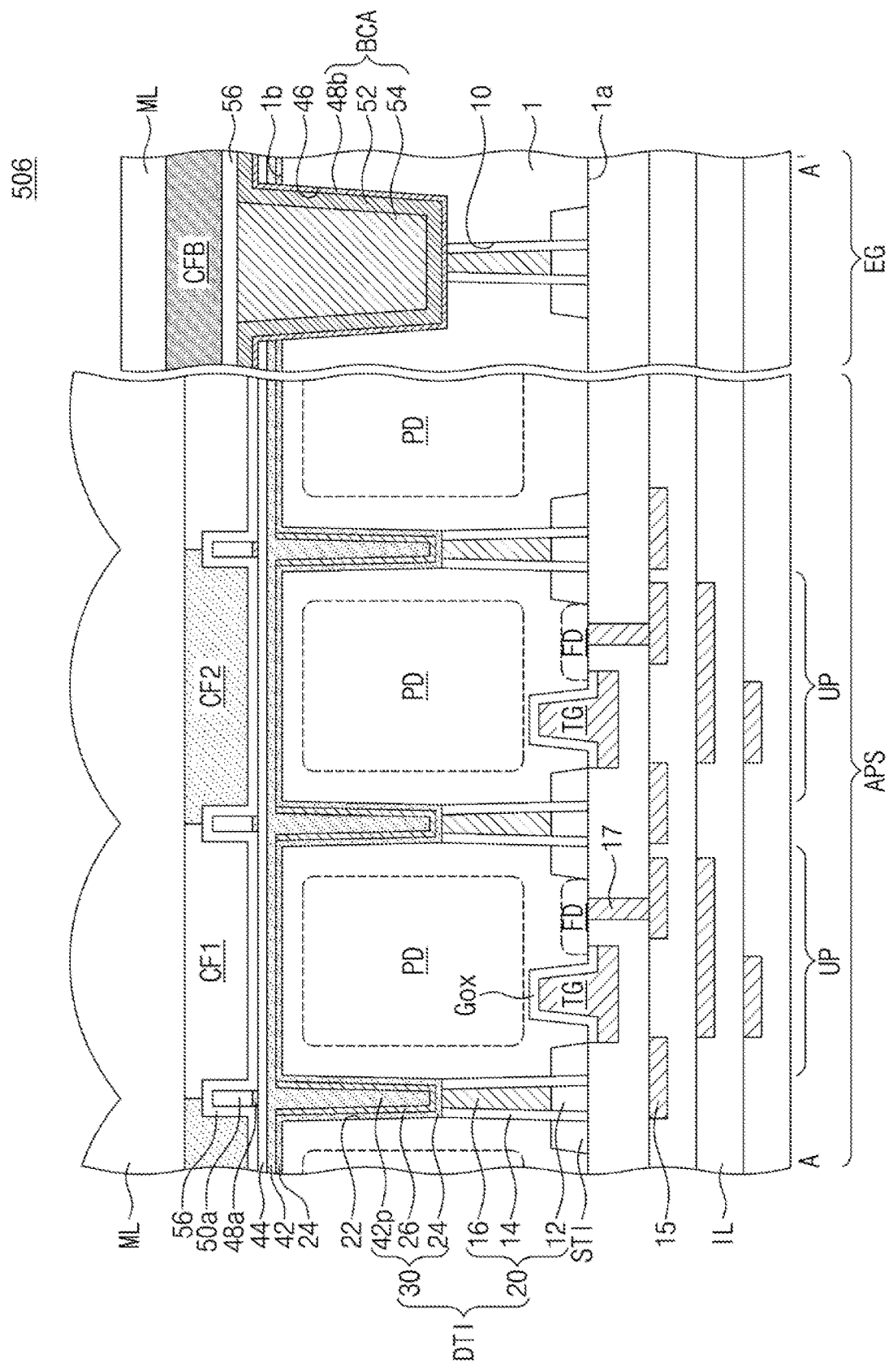
FIG. 14 is a cross-sectional view taken along the line A-A' of FIG. 11 according to embodiments of the inventive concepts.

FIG. 14 is a cross-sectional view taken along the line A-A' of FIG. 11 according to embodiments of the inventive concepts.

Referring to FIG. 14, in an image sensor 506 according to the present embodiments, a second conductive pattern 26 may not extend onto the second surface 1b. A first fixed charge layer 24 may be in contact with a second fixed charge layer 42. A portion 42p of the second fixed charge layer 42 may be inserted in the second trench 22. An upper portion of the second conductive pattern 26 may protrude from the second surface 1b. Other components and structures may be the same/similar as described with reference to FIGS. 12A and 12B.

Figure 15A:
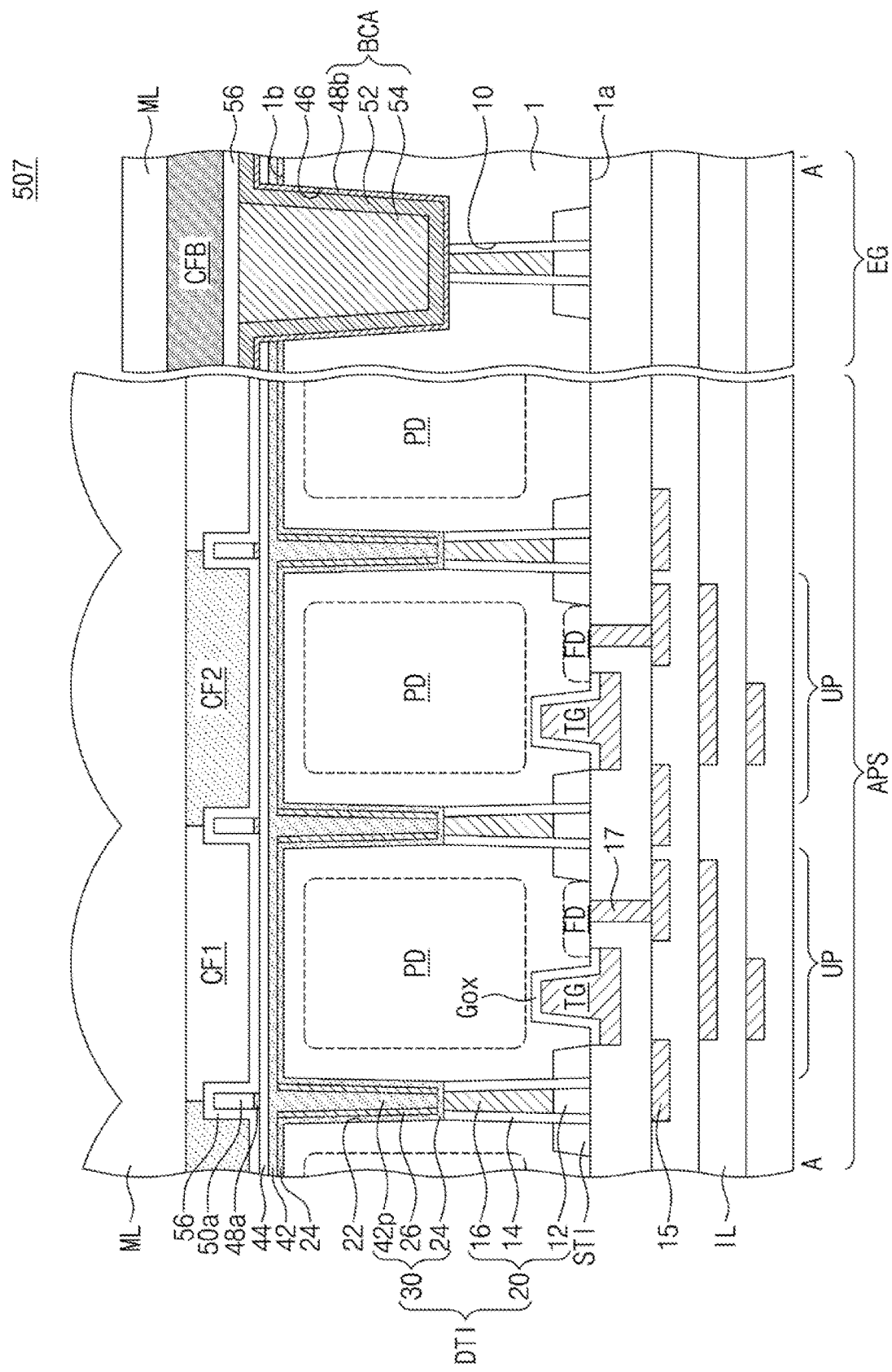
FIG. 15A is a cross-sectional view taken along the line A-A' of FIG. 11 according to embodiments of the inventive concepts.
Figure 15B:
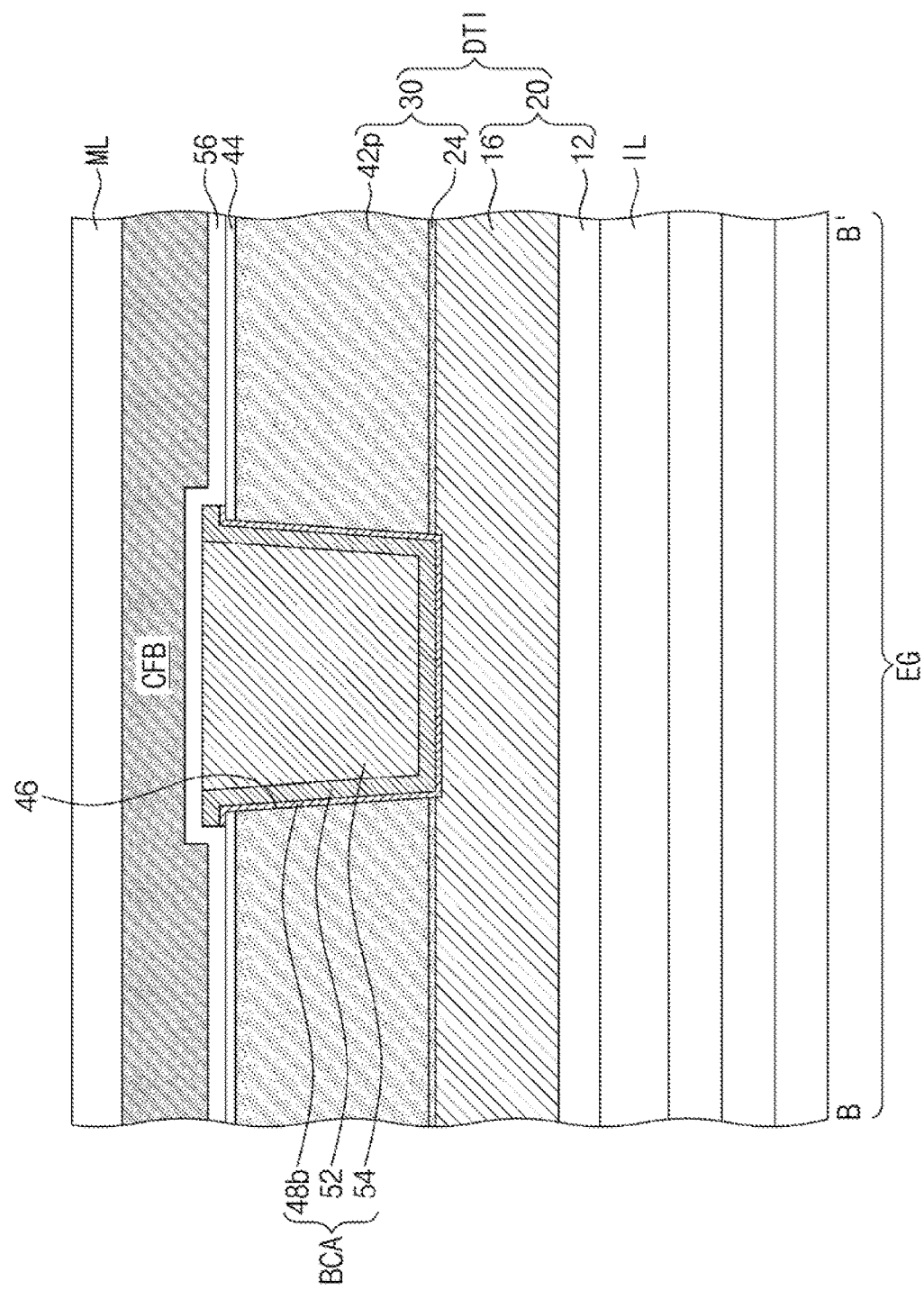
FIG. 15B is a cross-sectional view taken along the line B-B' of FIG. 11 according to embodiments of the inventive concepts.

FIG. 15A is a cross-sectional view taken along the line A-A' of FIG. 11 according to embodiments of the inventive concepts. FIG. 15B is a cross-sectional view taken along the line B-B' of FIG. 11 according to embodiments of the inventive concepts.

Referring to FIGS. 11, 15A and 15B, in an image sensor 507 according to the present embodiments, the portion 42p of the second fixed charge layer 42 in the second trench 22 in the structure of FIG. 14 may penetrate the second conductive pattern 26 to contact with the first fixed charge layer 24. In the cross-sectional views of FIGS. 15A and 15B, a connection contact BCA is not in contact with the second conductive pattern 26. However, in the present embodiments, the connection contact BCA may be in contact with the first sidewall SW1 (see FIG. 11) of the second conductive pattern 26. The second conductive pattern 26 may include two separate portions spaced apart from each other in the second trench 22. Other components may be the same/similar as described with reference to FIG. 14.

Figure 16A:
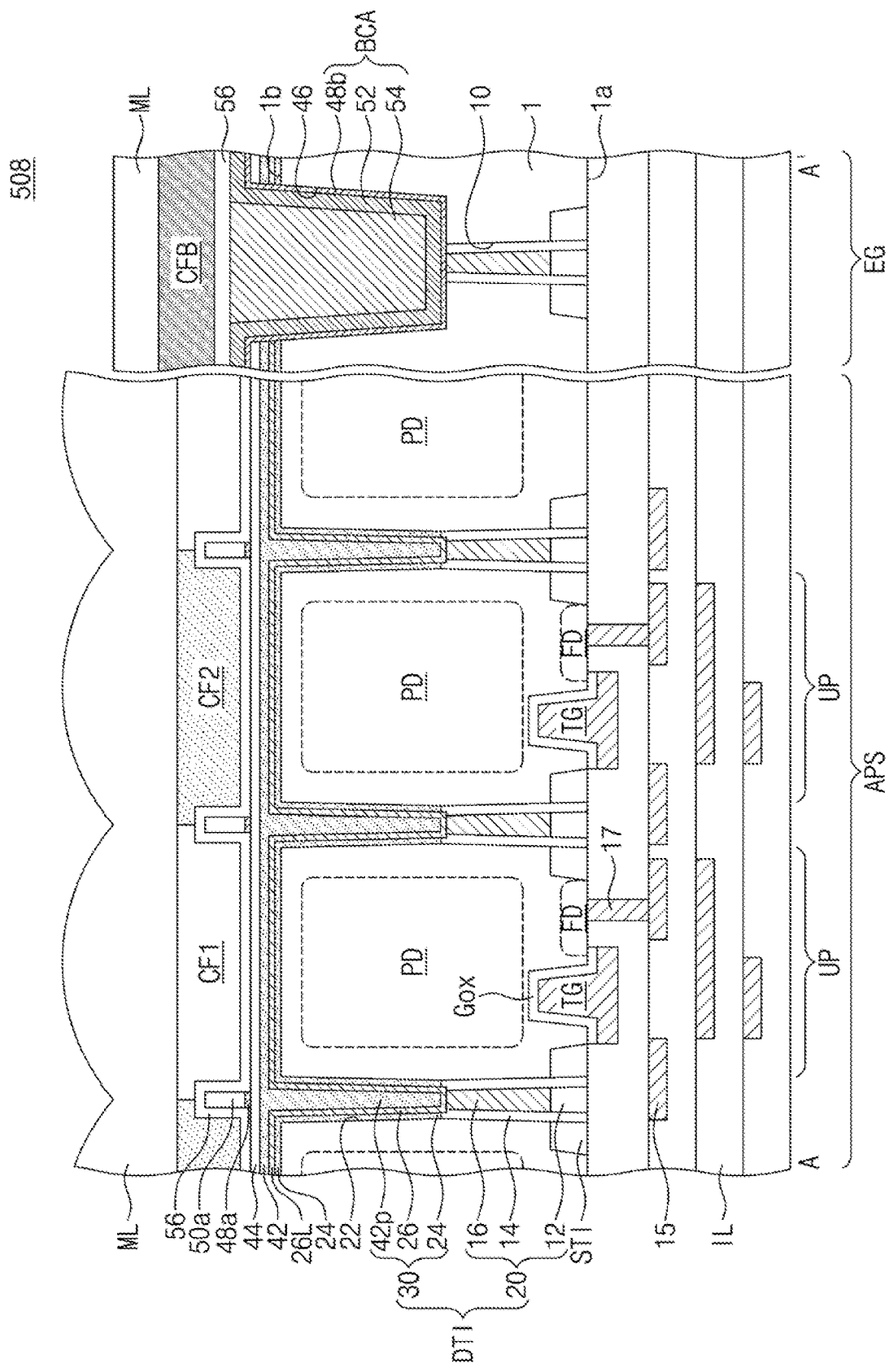
FIG. 16A is a cross-sectional view taken along the line A-A' of FIG. 11 according to embodiments of the inventive concepts.
Figure 16B:
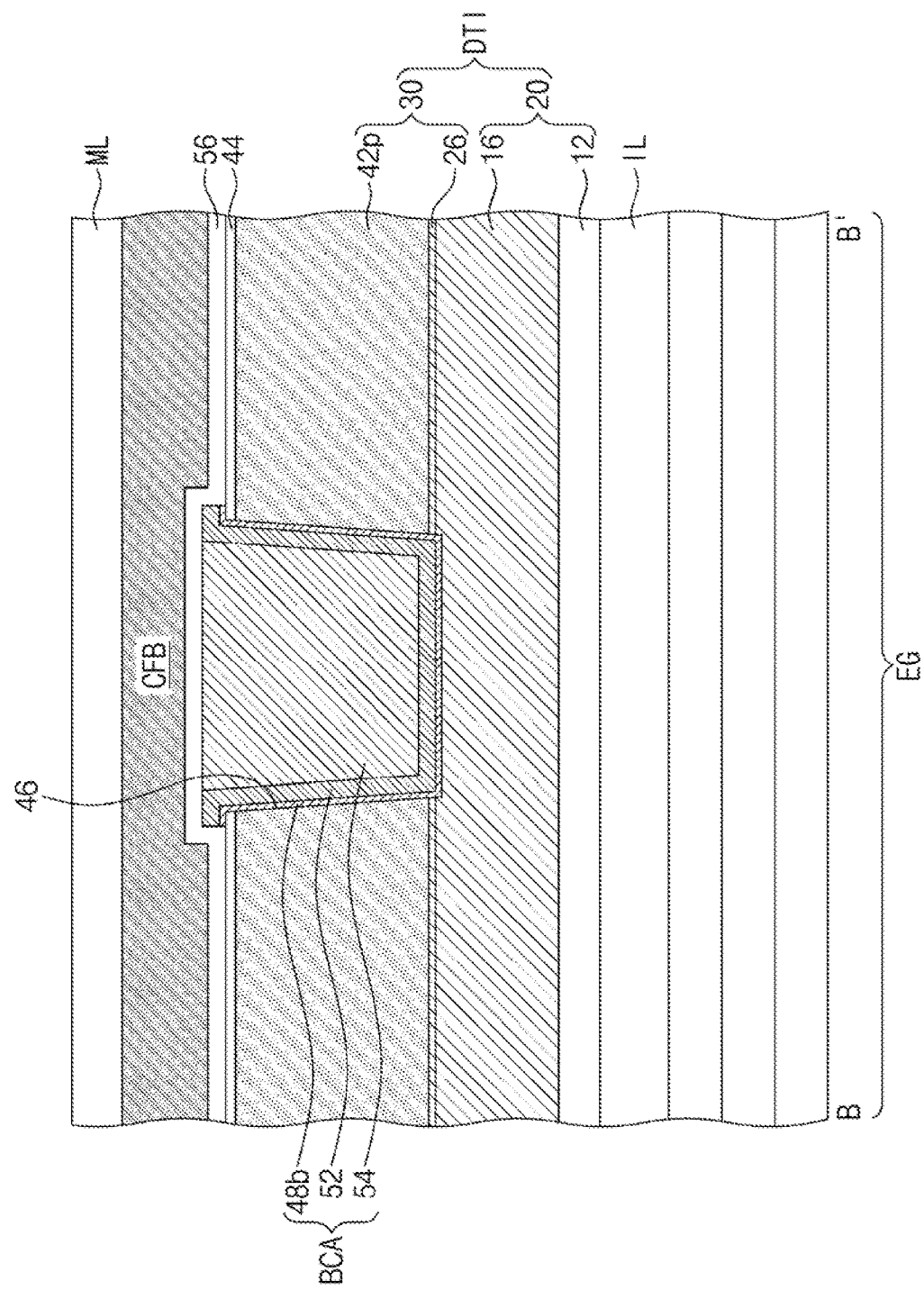
FIG. 16B is a cross-sectional view taken along the line B-B' of FIG. 11 according to embodiments of the inventive concepts.

FIG. 16A is a cross-sectional view taken along the line A-A' of FIG. 11 according to embodiments of the inventive concepts. FIG. 16B is a cross-sectional view taken along the line B-B' of FIG. 11 according to embodiments of the inventive concepts.

Referring to FIGS. 16A and 16B, in an image sensor 508 according to the present embodiments, the second conductive pattern 26 in the second trench 22 of FIG. 12A may penetrate the first fixed charge layer 24 to contact with the first conductive pattern 16. Other components may be the same/similar as described with reference to FIG. 12A.

Figure 17:
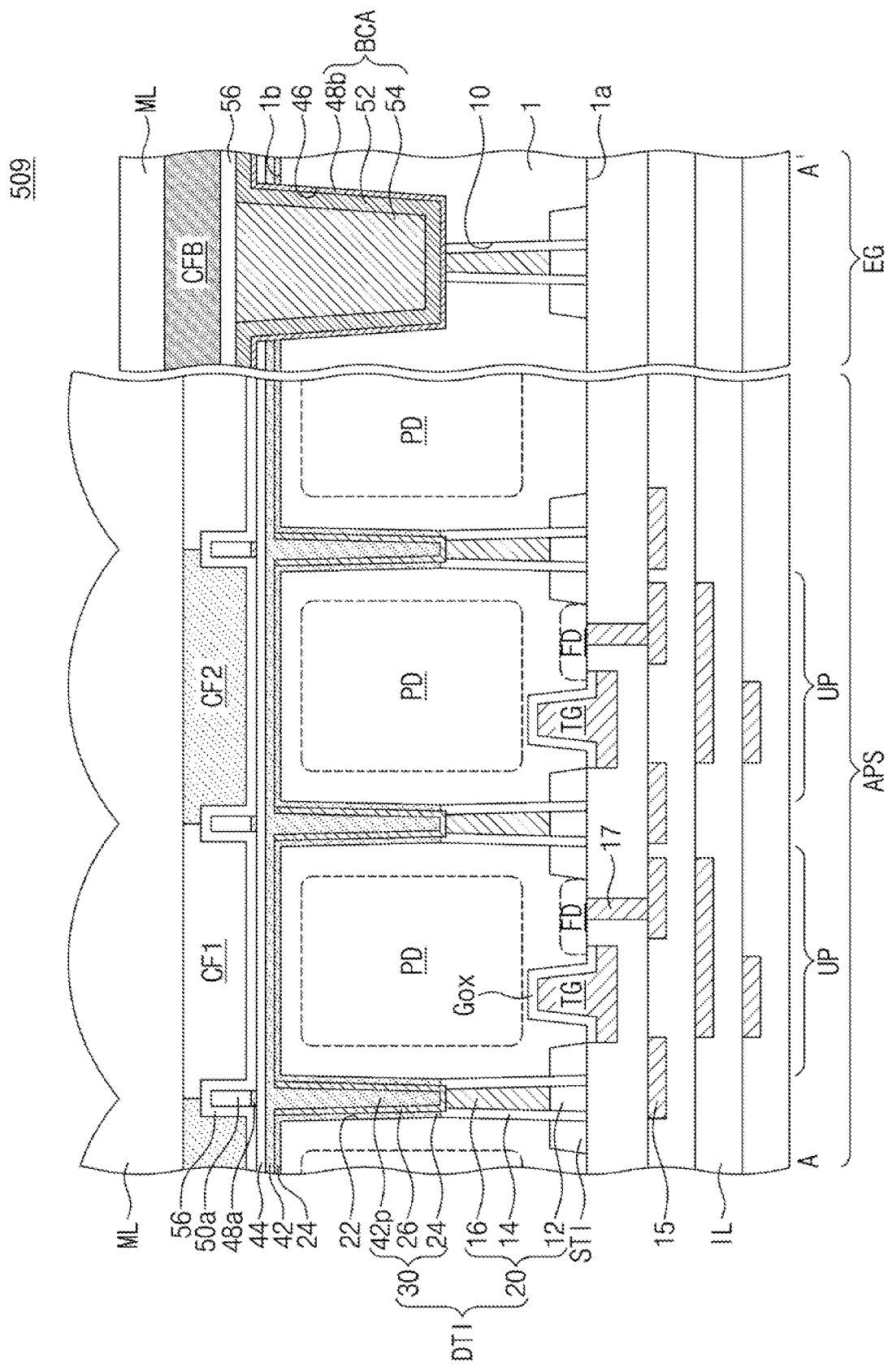
FIG. 17 is a cross-sectional view taken along the line A-A' of FIG. 11 according to embodiments of the inventive concepts.

FIG. 17 is a cross-sectional view taken along the line A-A' of FIG. 11 according to embodiments of the inventive concepts.

Referring to FIG. 17, in an image sensor 509 according to the present embodiments, the second conductive pattern 26 in the second trench 22 of FIG. 14 may penetrate the first fixed charge layer 24 to contact with the first conductive pattern 16. Other components may be the same/similar as described with reference to FIG. 14.

Figure 18:
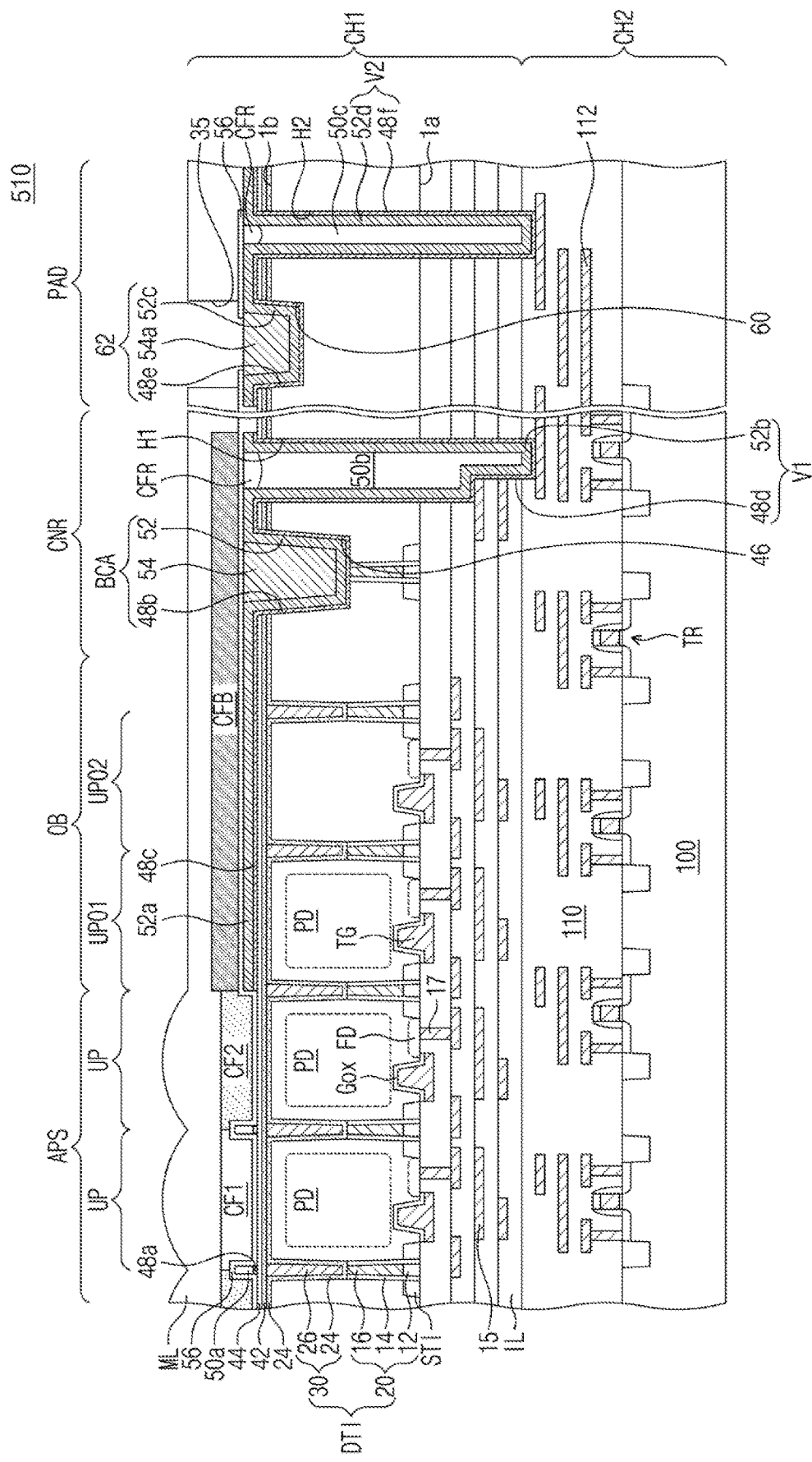
FIG. 18 is a cross-sectional view illustrating an image sensor according to embodiments of the inventive concepts.

FIG. 18 is a cross-sectional view illustrating an image sensor according to embodiments of the inventive concepts.

Referring to FIG. 18, an image sensor 510 according to the present embodiments may have a structure in which a first sub-chip CH1 and a second sub-chip CH2 are bonded to each other. For example, the first sub-chip CH1 may perform an image sensing function. For example, the second sub-chip CH2 may include circuits for driving the first sub-chip CH1 and/or for storing electrical signals generated from the first sub-chip CH1.

The second sub-chip CH2 may include a second substrate 100, a plurality of transistors TR disposed on the second substrate 100, a second interlayer insulating layer 110 covering the second substrate 100, and second interconnection lines 112 disposed in the second interlayer insulating layer 110. The second interlayer insulating layer 110 may have a single-layered or multi-layered structure including any one or any combination of a silicon oxide layer, a silicon nitride layer, a silicon oxynitride layer, and a porous insulating layer. The first sub-chip CH1 and the second sub-chip CH2 may be bonded to each other. Thus, a first interlayer insulating layer IL of the first sub-chip CH1 may be in contact with the second interlayer insulating layer 110.

The first sub-chip CH1 may include a first substrate 1 including a pad region PAD, a connection region CNR, an optical black region OB, and a pixel array region APS. The first sub-chip CH1 in the pixel array region APS and a portion of the connection region CNR may have the same structure as described with reference to FIGS. 3 and 4A. In other words, the pixel array region APS may include a plurality of unit pixels UP. In the pixel array region APS, a deep device isolation portion DTI may be disposed in the first substrate 1 to isolate the unit pixels UP from each other. A shallow device isolation portion STI may be disposed adjacent to a first surface 1*a* in the first substrate 1. The deep device isolation portion DTI may penetrate the shallow device isolation portion STI. A photoelectric conversion portion PD may be disposed in the first substrate 1 in each of the unit pixels UP. A transfer gate TG may be disposed on the first surface 1*a* of the first substrate 1 of each of the unit pixels UP. A floating diffusion region FD may be disposed in the first substrate 1 at a side of the transfer gate TG. The first surface 1*a* may be covered with the first interlayer insulating layers IL.

The deep device isolation portion DTI may include the first and second isolation portions 20 and 30 described with reference to FIGS. 3, 4A and 4B. The first isolation portion 20 may include first and second insulating patterns 12 and 14 and a first conductive pattern 16. The second isolation portion 30 may include a first fixed charge layer 24 and a second conductive pattern 26. The deep device isolation portion DTI may not be limited to the structure of FIGS. 4A and 4B but may have one of the structures described with reference to FIGS. 6 to 17.

Light may not be incident into the first substrate 1 of the optical black region OB. The deep device isolation portion DTI may also extend into the optical black region OB to isolate a first black pixel UP01 and a second black pixel UP02 from each other. The photoelectric conversion portion PD may be disposed in the first substrate 1 of the first black pixel UP01. The photoelectric conversion portion PD may not exist in the first substrate 1 of the second black pixel UP02. A transfer gate TG and a floating diffusion region FD may be disposed in each of the first and second black pixels UP01 and UP02. The first black pixel UP01 may sense the amount of charges generated from the photoelectric conversion portion PD into which light is not incident, and thus the first black pixel UP01 may provide a first reference charge amount. The first reference charge amount may be used as a relative reference value when the amounts of charges generated from the unit pixels UP are calculated. The second black pixel UP02 may sense the amount of charges generated in a state in which the photoelectric conversion portion PD does not exist, and thus the second black pixel UP02 may provide a second reference charge amount. The second reference charge amount may be used as data for removing process noise.

The first fixed charge layer 24, the second fixed charge layer 42, the first protective layer 44 and the second protective layer 56 may also extend onto the second surface 1*b* of the optical black region OB, the connection region CNR and the pad region PAD. The edge region EG described with reference to FIGS. 3, 4A and 4B may correspond to a portion of the connection region CNR of FIG. 18.

Referring to FIGS. 4B and 18, in the connection region CNR, a connection contact BCA may penetrate the first protective layer 44, the second fixed charge layer 42, the second conductive pattern 26, the first fixed charge layer 24 and a portion of the first substrate 1 to contact with the first conductive pattern 16 and the second insulating pattern 14 of the deep device isolation portion DTI. The connection contact BCA may be disposed in a third trench 46. The connection contact BCA may include a first diffusion barrier pattern 48*b* conformally covering an inner sidewall and a bottom surface of the third trench 46, a first metal pattern 52 on the first diffusion barrier pattern 48*b*, and a second metal pattern 54 filling the third trench 46.

A portion of the first diffusion barrier pattern 48*b* may extend onto the first protective layer 44 of the optical black region OB to provide a first optical black pattern 48*c*. A portion of the first metal pattern 52 may extend onto the first optical black pattern 48*c* of the optical black region OB to provide a second optical black pattern 52*a*. The second protective layer 56 may cover the second optical black pattern 52*a* and the connection contact BCA. A third optical black pattern CFB may be disposed on the second protective layer 56 in the optical black region OB and the connection region CNR.

In the connection region CNR, a first via V1 may be disposed at a side of the connection contact BCA. The first via V1 may be referred to as a back bias stack. The first via V1 may penetrate the first protective layer 44, the second fixed charge layer 42, the first fixed charge layer 24, the first substrate 1, the first interlayer insulating layers IL and a portion of the second interlayer insulating layer 110 to contact with both any one or any combination of the first interconnection lines 15 and any one or any combination of the second interconnection lines 112.

The first via V1 may be disposed in a first via hole H1. The first via V1 may include a second diffusion barrier pattern 48*d* and a first via pattern 52*b* on the second diffusion barrier pattern 48*d*. The second diffusion barrier pattern 48*d* may be connected to the first diffusion barrier pattern 48*b*. The first via pattern 52*b* may be connected to the first metal pattern 52. The connection contact BCA may be connected to any one or any combination of the first interconnection lines 15 and any one or any combination of the second interconnection lines 112 through the first via V1.

Each of the second diffusion barrier pattern 48*d* and the first via pattern 52*b* may conformally cover an inner surface of the first via hole H1. The second diffusion barrier pattern 48*d* and the first via pattern 52*b* may not completely fill the first via hole H1. A first low-refractive index residual layer 50*b* may fill the first via hole H1. A photoresist residual layer CFR may be disposed on the first low-refractive index residual layer 50*b*.

An external connection pad 62 and a second via V2 that are connected to each other may be disposed in the pad region PAD. The external connection pad 62 may penetrate the first protective layer 44, the second fixed charge layer 42, the first fixed charge layer 24, and a portion of the first substrate 1. The external connection pad 62 may be disposed in a fourth trench 60. The external connection pad 62 may include a third diffusion barrier pattern 48*e* and a first pad pattern 52*c* that sequentially and conformally cover an inner sidewall and a bottom surface of the fourth trench 60, and a second pad pattern 54*a* filling the fourth trench 60.

The second via V2 may penetrate the first protective layer 44, the second fixed charge layer 42, the first fixed charge layer 24, the first substrate 1, the first interlayer insulating layers IL and a portion of the second interlayer insulating layer 110 to contact with any one or any combination of the second interconnection lines 112. The external connection pad 62 may be connected to any one or any combination of the second interconnection lines 112 through the second via V2. The second via V2 may be disposed in a second via hole H2. The second via V2 may include a fourth diffusion barrier pattern 48f and a second via pattern 52d that sequentially and conformally cover an inner sidewall and a bottom surface of the second via hole H2. The fourth diffusion barrier pattern 48f and the second via pattern 52d may not completely fill the second via hole H2. A second low-refractive index residual layer 50c may fill the second via hole H2. A photoresist residual layer CFR may be disposed on the second low-refractive index residual layer 50c.

The light blocking pattern 48a, the first diffusion barrier pattern 48b, the first optical black pattern 48c and the second to fourth diffusion barrier patterns 48d to 48f may have the same thickness and the same material (e.g., titanium). The first metal pattern 52, the second optical black pattern 52a, the first via pattern 52b, the first pad pattern 52c and the second via pattern 52d may have the same thickness and the same material (e.g., tungsten). The second metal pattern 54 and the second pad pattern 54a may have the same material (e.g., aluminum).

The low-refractive index pattern 50a, the first low-refractive index residual layer 50b and the second low-refractive index residual layer 50c may have the same material. The photoresist residual layer CFR may have the same color and material as one of the color filters CF1 and CF2, or the photoresist residual layer CFR may have a photoresist material.

The second protective layer 56 may extend into the pad region PAD and may have an opening exposing the second pad pattern 54a. The micro lens array layer ML may extend into the optical black region OB, the connection region CNR and the pad region PAD. The micro lens array layer ML may have an opening 35 exposing the second pad pattern 54a in the pad region PAD.

Figure 19A:
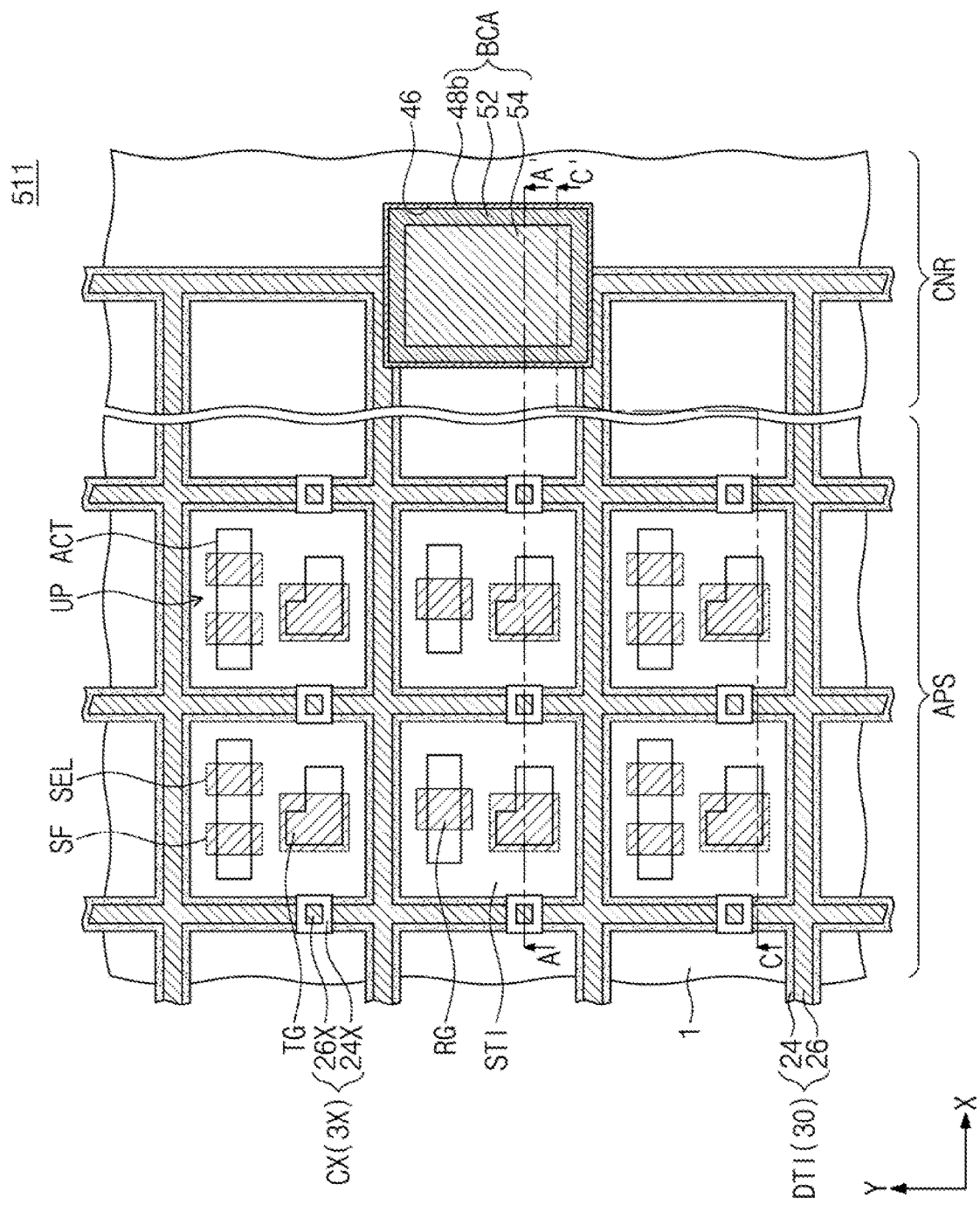
FIG. 19A is a plan view illustrating an image sensor according to embodiments of the inventive concepts.
Figure 19B:
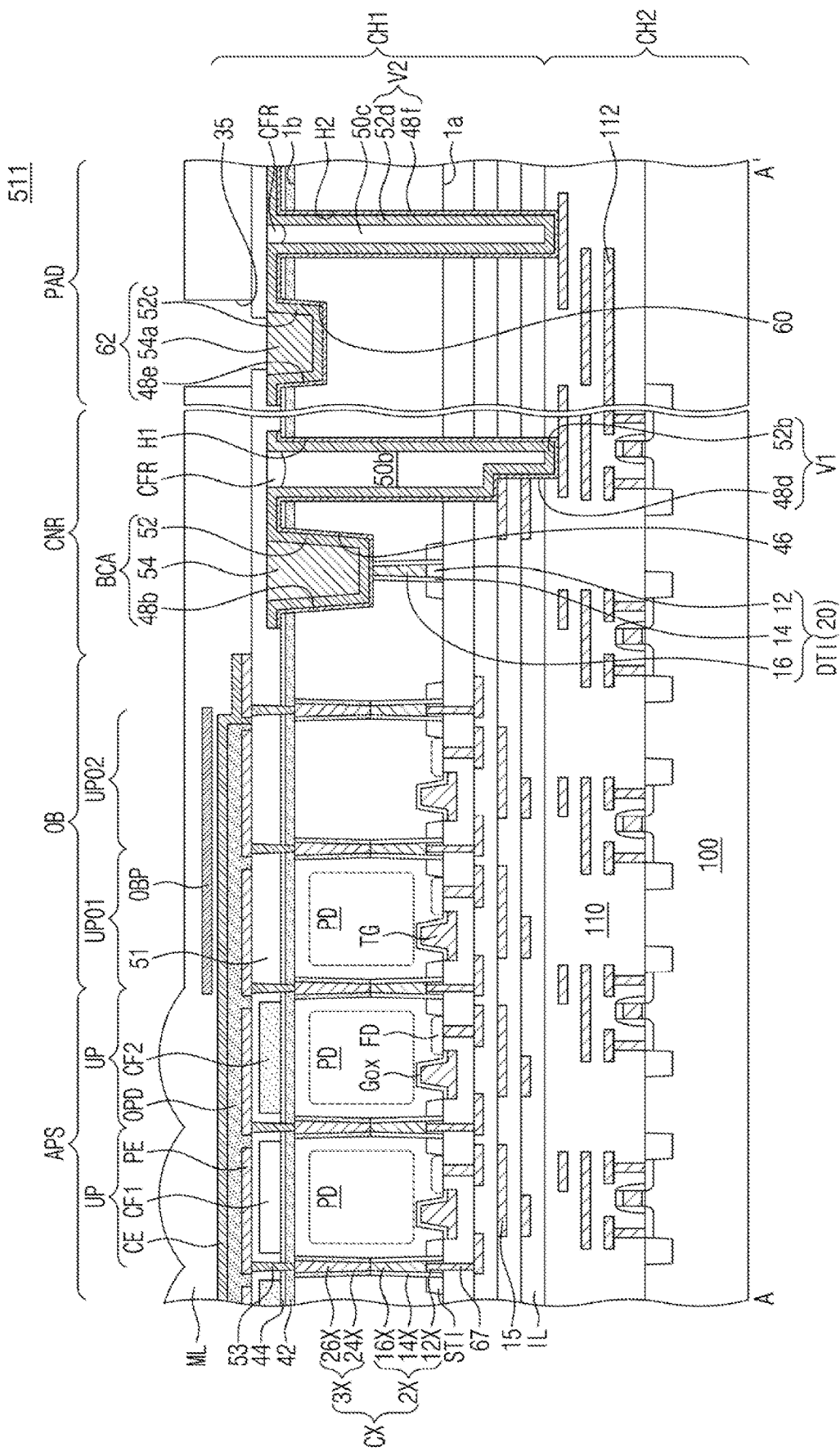
FIG. 19B is a cross-sectional view taken along a line A-A' of FIG. 19A.

FIG. 19A is a plan view illustrating an image sensor according to embodiments of the inventive concepts. FIG. 19B is a cross-sectional view taken along a line A-A' of FIG. 19A. An optical black region, a pad region and a portion of a connection region are omitted in FIG. 19A. A cross section taken along a line C-C' of FIG. 19A may include the deep device isolation portion DTI of FIG. 7A, instead of a through-contact structure CX of FIG. 19B. A cross-sectional view taken along the line C-C' of FIG. 19A may be the same/similar as FIG. 7A.

Referring to FIGS. 7A, 19A and 19B, an image sensor 511 according to the present embodiments may be an example of an organic CMOS image sensor. In the plan view of FIG. 19A, a through-contact structure CX penetrating a deep device isolation portion DTI may be disposed at a side of each of unit pixels UP. The through-contact structure CX may include a first contact portion 2X extending from a first surface 1a toward a second surface 1b and a second contact portion 3X extending from the second surface 1b toward the first surface 1a. The first contact portion 2X may include a first contact insulating pattern 12X, a second contact insulating pattern 14X, and a first contact pattern 16X. The second contact portion 3X may include a third contact insulating pattern 24X and a second contact pattern 26X. Each of the first to third contact insulating patterns 12X, 14X and 24X may include a single layer or multi-layer including any one or any combination of a silicon oxide layer, a silicon nitride layer, a silicon oxynitride layer, a hafnium oxide layer, and an aluminum oxide layer. Each of the first and second contact patterns 16X and 26X may include a conductive layer. The first and second contact patterns 16X and 26X may be insulated from the first substrate 1. The first and second contact patterns 16X and 26X may be in contact with each other. The first and second contact patterns 16X and 26X may be insulated from the first and second conductive patterns 16 and 26 of the deep device isolation portion DTI.

A second contact plug 67 may penetrate one, closest to the first surface 1a, of the first interlayer insulating layers IL and the first contact insulating pattern 12X to contact with the first contact pattern 16X. The second contact plug 67 may be connected to one of the first interconnection lines 15. Each of color filters CF1 and CF2 may have a blue color or a red color. A planarization layer 51 may cover the color filters CF1 and CF2. For example, the planarization layer 51 may include silicon oxide and/or PETEOS. In the pixel array region APS and the optical black region OB, pixel electrodes PE may be disposed on the planarization layer 51 and may be spaced apart from each other. The pixel electrodes PE may overlap with the unit and black pixels UP, UP01 and UP02, respectively. A third contact plug 53 may penetrate the planarization layer 51 and may electrically connect the pixel electrode PE to the through-contact structure CX.

The pixel electrodes PE may be covered with an organic photoelectric conversion layer OPD. The organic photoelectric conversion layer OPD may include a P-type organic semiconductor material and an N-type organic semiconductor material, which form a PN junction. Alternatively, the organic photoelectric conversion layer OPD may include quantum dots or a chalcogenide. The organic photoelectric conversion layer OPD may perform photoelectric conversion of light having a color (e.g., a green color). A common electrode CE may be disposed on the organic photoelectric conversion layer OPD. The pixel electrodes PE and the common electrode CE may include indium tin oxide (ITO), indium zinc oxide (IZO), zinc oxide (ZnO), and/or an organic transparent conductive material.

A micro lens array layer ML may be disposed on the common electrode CE. An optical black pattern OBP may be disposed in the micro lens array layer ML in the optical black region OB. The optical black pattern OBP may include, for example, an opaque metal (e.g., aluminum). Other components may be the same/similar as described with reference to FIGS. 7A and 18. The image sensor 511 according to the present embodiments may include the organic photoelectric conversion layer OPD, and thus each of the unit pixels UP may sense two colors of light at the same time.

The image sensor according to the inventive concepts may include the first isolation portion extending from the first surface toward the second surface and the second isolation portion extending from the second surface toward the first surface, and thus process defects may be reduced or minimized and a thickness of the substrate may be increased. As a result, a received amount of incident light may be increased, and photosensitivity may be improved. Therefore, clear image quality may be realized.

In addition, the first and second isolation portions may include the second insulating pattern, the first fixed charge layer and the first and second conductive patterns, respectively, and thus a negative bias voltage may be applied to both the first and second isolation portions to reduce or minimize a dark current.

The second conductive pattern included in the second isolation portion may be formed of, for example, the polysilicon or silicon-germanium doped with boron at a temperature of 400 degrees Celsius or less. As a result, the first interconnection lines may not be damaged when the second conductive pattern is formed, and thus reliability of the image sensor may be improved.

In the method of manufacturing the image sensor according to the inventive concepts, the first and second trenches for the deep device isolation portion may be formed instead of a single deep trench, and thus defects of an etching process may be reduced to improve a yield. In addition, the second conductive pattern of the second isolation portion of the deep device isolation portion may be formed at a temperature of 400 degrees Celsius or less, and thus damage of an interconnection layer may be prevented.

While the inventive concepts have been described with reference to example embodiments, it will be apparent to those skilled in the art that various changes and modifications may be made without departing from the spirits and scopes of the inventive concepts. Therefore, it may be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An image sensor comprising:
    a substrate comprising:
        a first surface;
        a second surface opposite to the first surface; and
        unit pixels;
    a deep device isolation portion disposed in the substrate to isolate the unit pixels from each other;
    transfer gates disposed on the first surface, wherein the transfer gates are respectively disposed in the unit pixels; and
    color filters and a micro lens array layer that are sequentially stacked on the second surface,
    wherein the deep device isolation portion comprises:
        a first conductive pattern extending from the first surface toward the second surface; and
        a second conductive pattern extending from the second surface toward the first conductive pattern, and
    wherein the first conductive pattern directly contacts the second conductive pattern.

2. An image sensor comprising:
    a substrate comprising:
        a first surface;
        a second surface opposite to the first surface; and
        unit pixels;
    a deep device isolation portion disposed in the substrate to isolate the unit pixels from each other; and
    transfer gates disposed on the first surface, wherein the transfer gates are respectively disposed the unit pixels,
    wherein the deep device isolation portion comprises:
        a first conductive pattern extending from the first surface toward the second surface;
        a first insulating pattern between the first conductive pattern and the substrate;
        a second conductive pattern extending from the second surface toward the first conductive pattern; and
        a first fixed charge layer between the second conductive pattern and the substrate,
    wherein the first insulating pattern has a first width, and
    wherein the first fixed charge layer has a second width different from the first width.

3. The image sensor of claim 2, wherein the first fixed charge layer extends to be between the first conductive pattern and the second conductive pattern.

4. The image sensor of claim 2, wherein the first fixed charge layer extends to be disposed on the second surface.

5. The image sensor of claim 2, wherein the second conductive pattern has a third width less than the second width.

6. The image sensor of claim 5, wherein the first conductive pattern has a fourth width greater than the third width.

7. The image sensor of claim 2, wherein a portion of the second conductive pattern extends to be disposed on the second surface, and
    wherein the second conductive pattern disposed on the second surface has a thickness of 5 Å to 100 Å.

8. The image sensor of claim 2, wherein the second conductive pattern comprises a hollow cup or cylinder-shaped cross section, and
    wherein the image sensor further comprises a second fixed charge layer filling an inside of the second conductive pattern.

9. The image sensor of claim 2, wherein the substrate further includes an edge region spaced apart from the unit pixels,
    wherein the deep device isolation portion extends into the edge region,
    wherein the first fixed charge layer extends to be between the first conductive pattern and the second conductive pattern, and
    wherein the image sensor further comprises a connection contact penetrating through the second conductive pattern and the first fixed charge layer in the edge region, to contact with the first conductive pattern.

10. The image sensor of claim 9, wherein the connection contact contacts a sidewall of the second conductive pattern.

11. An image sensor comprising:
    a substrate comprising:
        a first surface; and
        a second surface opposite to the first surface;
        a pixel array region; and
        an edge region;
    a deep device isolation portion disposed in the substrate and in the pixel array region to isolate unit pixels from each other, the deep device isolation portion extending into the edge region;
    a connection contact penetrating through a portion of the deep device isolation portion in the edge region; and
    transfer gates disposed on the first surface, wherein the transfer gates are respectively disposed the unit pixels,
    wherein the deep device isolation portion comprises:
        a first conductive pattern extending from the first surface toward the second surface;
        a first insulating pattern between the first conductive pattern and the substrate;
        a second conductive pattern extending from the second surface toward the first conductive pattern; and
        a first fixed charge layer between the second conductive pattern and the substrate, and
    wherein the connection contact contacts both the first conductive pattern and the second conductive pattern.

12. The image sensor of claim 11, further comprising color filters and a micro lens array layer that are sequentially stacked on the second surface,
    wherein the first conductive pattern contacts the second conductive pattern.

13. The image sensor of claim 11, wherein the first fixed charge layer extends to be between the first conductive pattern and the second conductive pattern, and
    wherein the connection contact penetrates through the second conductive pattern and the first fixed charge layer in the edge region, to contact with the first conductive pattern.

14. The image sensor of claim 11, wherein the first fixed charge layer extends to be disposed on the second surface.

15. The image sensor of claim 11, wherein a portion of the second conductive pattern extends to be disposed on the second surface, and
wherein the second conductive pattern disposed on the second surface has a thickness of 5 Å to 100 Å.

16. An image sensor comprising:
a substrate comprising:
a first surface;
a second surface opposite to the first surface; and
unit pixels;
a deep device isolation portion disposed in the substrate to isolate the unit pixels from each other; and
transfer gates disposed on the first surface, wherein the transfer gates are respectively disposed the unit pixels,
wherein the deep device isolation portion comprises:
a first conductive pattern extending from the first surface toward the second surface;
a first insulating pattern between the first conductive pattern and the substrate;
a second conductive pattern extending from the second surface toward the first conductive pattern; and
a first fixed charge layer between the second conductive pattern and the substrate,
wherein the substrate further comprises an edge region spaced apart from the unit pixels, and
wherein the image sensor further comprises a connection contact penetrating through the second conductive pattern and the first fixed charge layer in the edge region, to contact with the first conductive pattern.

17. The image sensor of claim 16, further comprising color filters and a micro lens array layer that are sequentially stacked on the second surface,
wherein the first insulating pattern has a first width,
wherein the first fixed charge layer has a second width greater than the first width, and
wherein the second conductive pattern has a third width less than the second width.

18. The image sensor of claim 17, wherein the first conductive pattern has a fourth width greater than the third width.

19. The image sensor of claim 16, wherein a portion of the second conductive pattern extends to be disposed on the second surface, and
wherein the second conductive pattern disposed on the second surface has a thickness of 5 Å to 100 Å.

20. The image sensor of claim 16, wherein the second conductive pattern comprises a hollow cup or cylinder-shaped cross section, and
wherein the image sensor further comprises a second fixed charge layer filling an inside of the second conductive pattern.

21. The image sensor of claim 16, wherein the second conductive pattern comprises poly-silicon or silicon-germanium doped with boron.

* * * * *